(12) United States Patent
Sun et al.

(10) Patent No.: US 9,343,306 B2
(45) Date of Patent: May 17, 2016

(54) METHOD OF FABRICATING THIN FILM TRANSISTOR ARRAY SUBSTRATE HAVING POLYSILICON WITH DIFFERENT GRAIN SIZES

(71) Applicant: Au Optronics Corporation, Hsinchu (TW)

(72) Inventors: Ming-Wei Sun, Hsinchu County (TW); Chih-Wei Chao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 1 day.

(21) Appl. No.: 14/488,301

(22) Filed: Sep. 17, 2014

(65) Prior Publication Data
US 2015/0004761 A1    Jan. 1, 2015

Related U.S. Application Data

(62) Division of application No. 12/337,583, filed on Dec. 17, 2008, now Pat. No. 8,884,304.

(30) Foreign Application Priority Data

Sep. 4, 2008   (TW) ................................ 97133971 A

(51) Int. Cl.
*H01L 29/786* (2006.01)
*H01L 21/02* (2006.01)
*H01L 27/12* (2006.01)
(Continued)

(52) U.S. Cl.
CPC .... *H01L 21/02675* (2013.01); *H01L 21/02532* (2013.01); *H01L 21/02595* (2013.01); *H01L 27/12* (2013.01); *H01L 27/1214* (2013.01); *H01L 27/1274* (2013.01);
(Continued)

(58) Field of Classification Search
CPC ............ G02F 1/13454; H01L 21/2026; H01L 27/1285; Y10S 117/904
USPC ................ 257/66, 72, 75, E27.111, E29.286, 257/E29.293, E29.295, E29.297; 349/43, 349/44
See application file for complete search history.

(56) References Cited

U.S. PATENT DOCUMENTS 6,396,560 B1    5/2002 Noguchi et al.
2003/0132437 A1*  7/2003 Yamaguchi ......... H01L 21/2026
                                                    257/64
(Continued)

FOREIGN PATENT DOCUMENTS

TW            I256516         6/2006

*Primary Examiner* — Thomas L Dickey
(74) *Attorney, Agent, or Firm* — Jianq Chyun IP Office

(57) ABSTRACT

A thin film transistor array substrate includes a substrate, a plurality of poly-silicon islands and a plurality of gates. The substrate has a display region, a gate driver region and a source driver region. Each poly-silicon island disposed on the substrate has a source region, a drain region and a channel region disposed therebetween. The poly-silicon islands include several first poly-silicon islands and several second poly-silicon islands. The first poly-silicon islands having main grain boundaries and sub grain boundaries are only disposed within the display region and the gate driver region. The main grain boundaries of the first poly-silicon islands are only disposed within the source regions and/or the drain regions. The second poly-silicon islands are disposed in the source driver region. Grain sizes of the first poly-silicon islands are substantially different from those of the second poly-silicon islands. Gates corresponding to the channel regions are disposed on the substrate.

14 Claims, 19 Drawing Sheets

(51) Int. Cl.
*H01L 29/04* (2006.01)
*H01L 29/66* (2006.01)
*H01L 21/268* (2006.01)

(52) U.S. Cl.
CPC ........... *H01L 27/1285* (2013.01); *H01L 29/04* (2013.01); *H01L 29/66757* (2013.01); *H01L 21/268* (2013.01)

(56) References Cited

U.S. PATENT DOCUMENTS

2003/0147018 A1* 8/2003 Sano .................... G02F 1/13454
349/42
2006/0009016 A1 1/2006 Yamazaki et al.

* cited by examiner

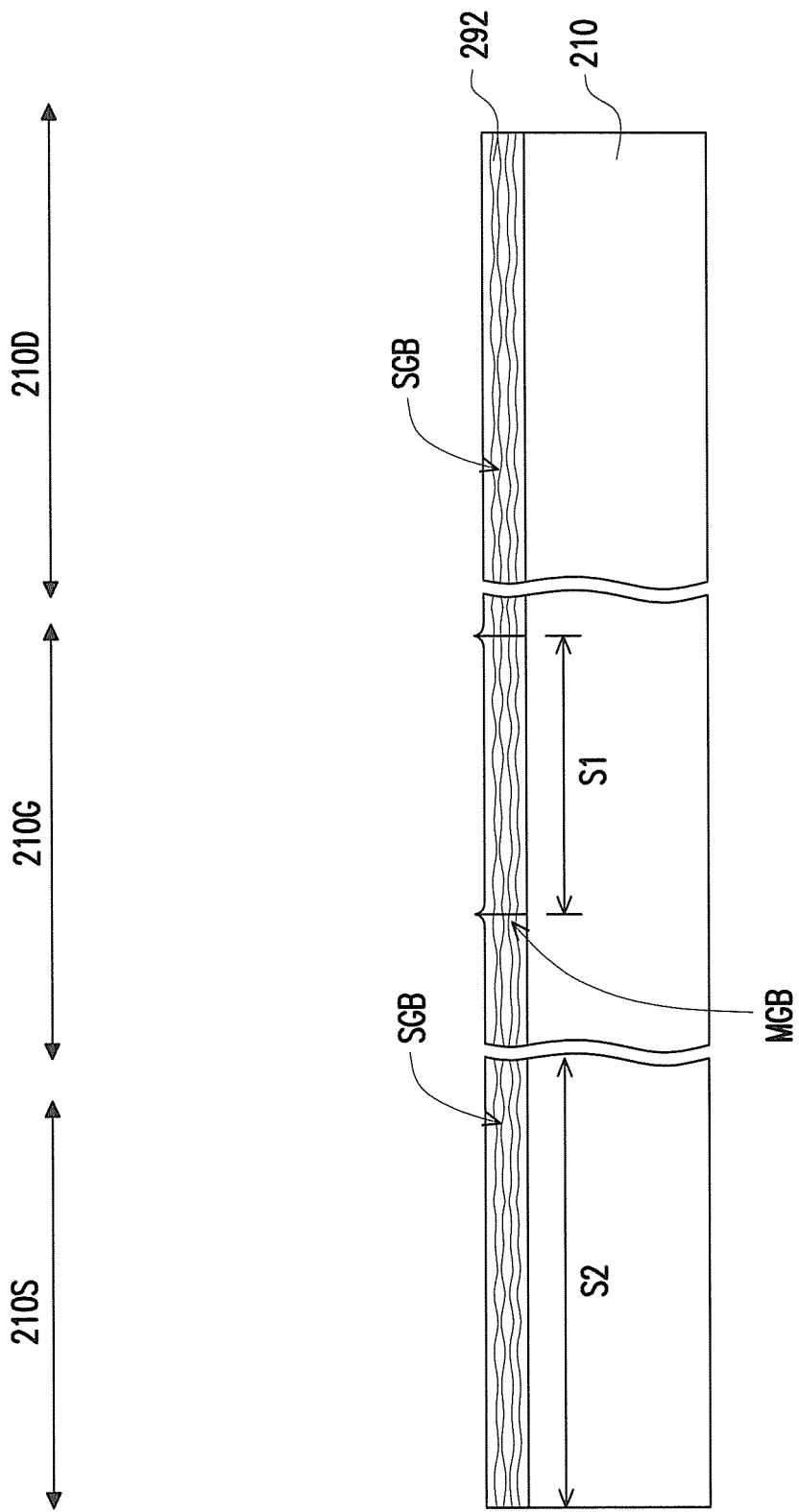

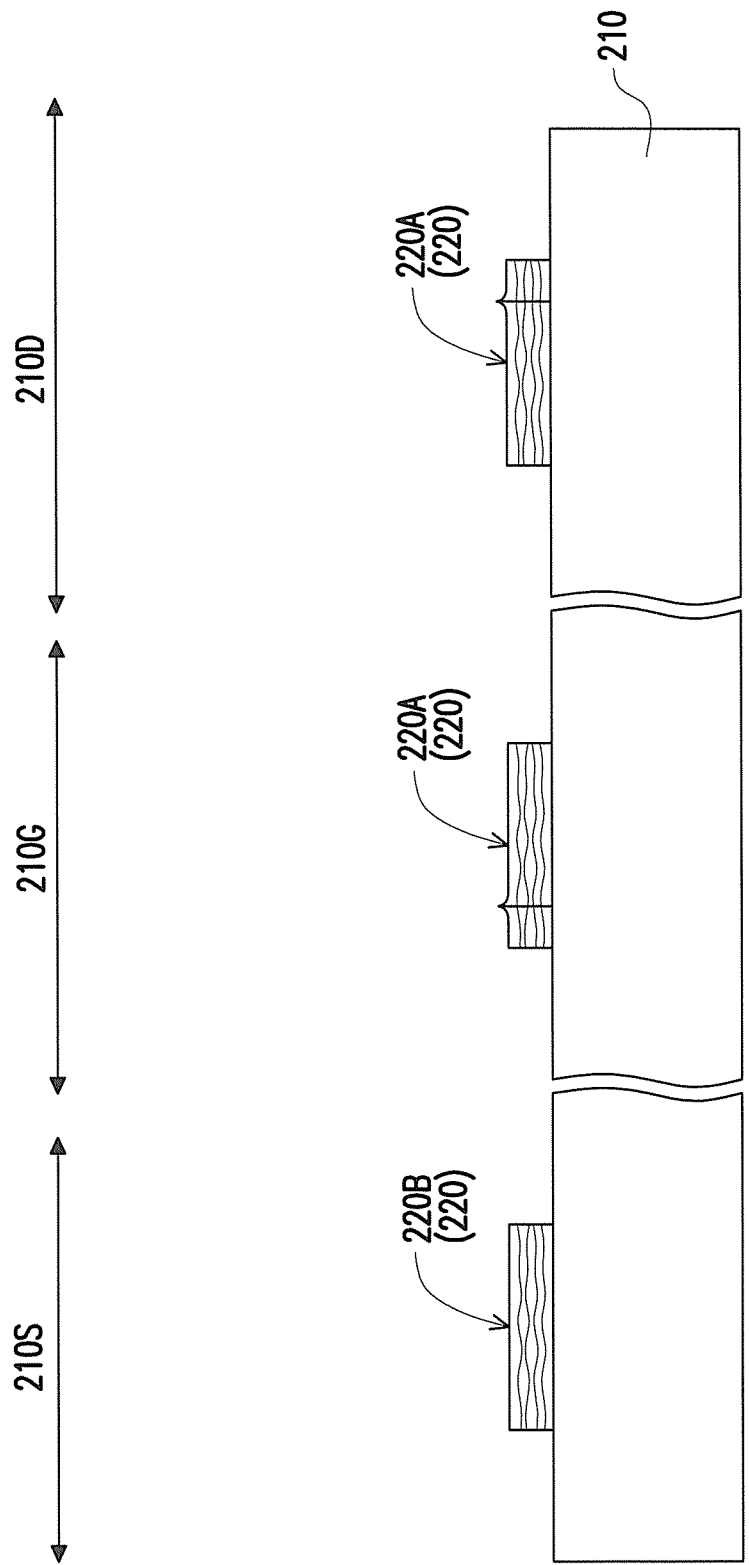

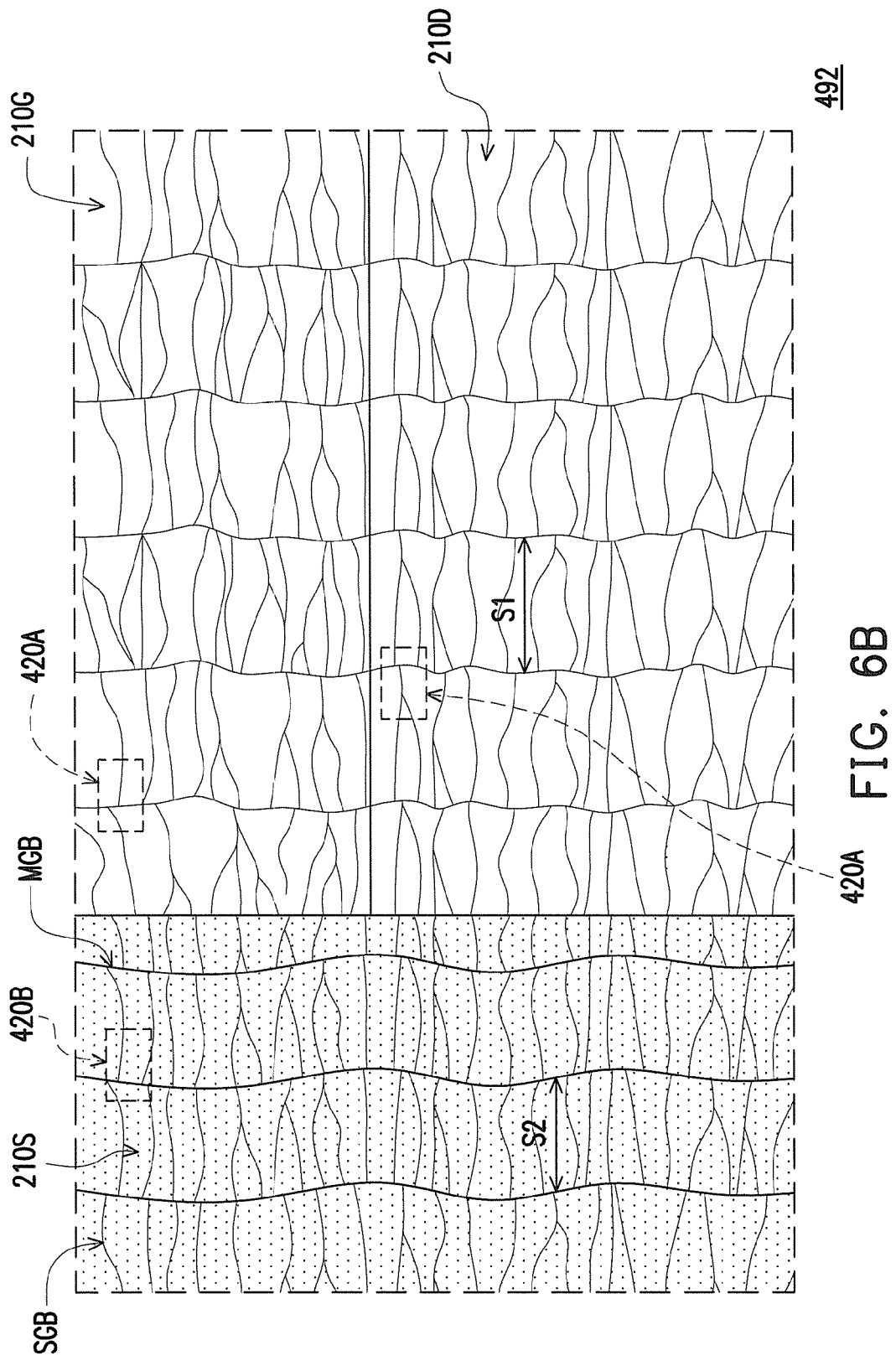

METHOD OF FABRICATING THIN FILM TRANSISTOR ARRAY SUBSTRATE HAVING POLYSILICON WITH DIFFERENT GRAIN SIZES

CROSS-REFERENCE TO RELATED APPLICATION

This application is a divisional application of U.S. application Ser. No. 12/337,583, filed on Dec. 17, 2008, now pending. The prior application Ser. No. 12/337,583 claims the priority benefit of Taiwan application serial no. 97133971, filed on Sep. 4, 2008. The entirety of each of the above-mentioned patent applications is hereby incorporated by reference herein and made a part of this specification.

BACKGROUND OF THE INVENTION

1. Field of the Invention

The present invention relates to a semiconductor device array substrate and a method of fabricating a semiconductor device array substrate, especially a thin film transistor (TFT) array substrate and a method of fabricating a TFT array substrate.

2. Description of Related Art

In recent years, with the progressive manufacturing techniques in optoelectronic and semiconductor fields, flat panel displays are growing rapidly, wherein liquid crystal displays (LCDs) have gradually replaced conventional cathode ray tube displays and have become the mainstream due to its low operating voltage, no radiation, light weight and small volume.

Generally, LCDs are classified into amorphous silicon TFT LCDs and low temperature poly-silicon TFT LCDs. When compared to amorphous silicon TFTs, low temperature poly-silicon TFTs have higher electron mobility (about 100 to 1000 times than that of amorphous silicon TFT). Therefore in addition to being used as pixel electrodes, poly-silicon TFTs can be applied to peripheral circuit regions to be used as circuits that drive LCDs.

In practice, TFTs that are used as pixel electrodes and TFTs that drive circuits require different properties. Generally, TFTs that are used as pixel electrodes have higher demands on uniformity of electrical properties, while TFTs that driver circuits require electrical properties of carrier mobility and high reliability. Device characteristics of TFTs are related to crystal forms and crystal positions of poly-silicon films in the TFTs, and the crystal forms of poly-silicon layers are controlled according to different processes. In recent years, low temperature poly-silicon thin film crystallization methods have been extensively studied, wherein excimer laser crystallization is the mainstream crystallization method.

In order to obtain TFTs of excellent device characteristics, a thin beam directional X'tallization (TDX) process has been proposed, which mainly uses a substrate carrier moving within a sub-micro range and a high-precision optical system added to an original excimer laser system, and uses the following two methods: (1) using the size of a mask slit to pattern a laser beam, so that an amorphous silicon region irradiated with the laser beam starts to crystallize from two sides to the center, and before the main crystal boundary of the irradiated region has not formed yet, moving the mask within a single scan pitch wherein the scan pitch is not greater than half the region of the mask slit. (2) Extending the length and narrowing the width of the laser beam, so that the amorphous silicon region irradiated with the laser beam starts to crystallize from two sides of the short axis to the center transversely, and before the main crystal boundary of the irradiated region has not formed yet, moving the substrate carrier within a single scan pitch wherein the scan pitch is not greater than half the wide region of the short axis of the laser beam. By repeating the above steps (1) or (2), a region of transverse crystallization on the thin film is controlled, and poly-silicon grains grow continuously and do not form main grain boundaries, so that a poly-silicon thin film of high crystal quality is obtained, wherein the size of the crystal grains of the poly-silicon is larger than that obtained by conventional excimer laser crystallization.

However, in the above TDX laser crystallization technique, the laser beam irradiates the amorphous silicon layer disposed on the substrate, and when the substrate is moved during scan operations of the TDX laser crystallization method, the substrate can only be moved within half the region of substrate irradiated by the laser beam. Therefore, when performing scan operations of the TDX laser crystallization method along a direction, not only more laser shots are required, the substrate is also moved more times totally. Hence, although a poly-silicon film of high quality is obtained, the process time is increased so that enhancement in productivity is unfavorable. In addition, the substrate or the mask is moved a single scan pitch. Although the poly-silicon in different regions on the substrate are the same, more laser shots are required, so the total times of moving the substrate or the mask are increased. Hence, although a poly-silicon film of uniform quality is obtained, which means that the main crystal boundaries of the poly-silicon on all positions of the substrate are uniformly distributed, the process time on the substrate is increased so that enhancement in productivity is unfavorable.

SUMMARY OF THE INVENTION

The present invention provides a TFT array substrate, which has a TFT of high carrier mobility and enhances processing efficiency and productivity.

The present invention provides a method of fabricating a TFT array substrate, which fabricates a TFT of high carrier mobility and enhances processing efficiency and productivity.

The present invention provides a TFT array substrate, which comprises a substrate, a plurality of poly-silicon islands and a plurality of gates. The substrate comprises a display region, a gate driver region, and a source driver region. The poly-silicon islands are disposed on the substrate, and each of the poly-silicon islands comprises a source region, a drain region, and a channel region disposed between the source region and the drain region. The poly-silicon islands comprise a plurality of first poly-silicon islands and a plurality of second poly-silicon islands, wherein the first poly-silicon islands are disposed in the display region and the gate driver region and have main grain boundaries and sub grain boundaries. The main grain boundaries of the first poly-silicon islands are only disposed within the source regions and/or the drain region. The second poly-silicon islands are disposed in the source driver region, wherein grain sizes of the first poly-silicon islands are different from grain sizes of the second poly-silicon islands. The gates are disposed on the substrate and being corresponds to the channel regions.

The present invention further provides a method of fabricating a TFT array substrate that comprises the following steps. First, a substrate is provided, and the substrate comprises a display region, a gate diver region and a source driver region. Then, an amorphous silicon layer is formed on the substrate. Next, by irradiating the amorphous silicon layer with a laser beam, a poly-silicon layer is formed, wherein the poly-silicon layer comprises a plurality of main grain boundaries and a plurality of sub grain boundaries. Grain sizes of the poly-silicon layer disposed in the display region and the gate driver region is different from grain sizes of the poly-silicon layer disposed in the source diver region. Afterwards, the poly-silicon layer is patterned to form a plurality of poly-silicon islands, wherein the poly-silicon islands disposed in the display region and the gate driver region form a plurality of first poly-silicon islands, and the poly-silicon islands disposed in the source driver region form a plurality of second poly-silicon islands. Then, a source region, a drain region and a channel region disposed between the source region and the drain region in each of the first poly-silicon islands and each of the second poly-silicon islands are defined, wherein the main grain boundary of each of the first poly-silicon islands is only disposed within the source regions and/or the drain regions of each of the first poly-silicon islands. Last, a plurality of gates is formed on the substrate, so that the gates correspond to the channel regions.

According to an embodiment of the present invention, in the above step of forming the poly-silicon layer by using the laser beam to irradiate the amorphous silicon layer, grain sizes of the poly-silicon islands formed in different regions in the display region and the gate driver region have various sizes. The display region and the gate driver region comprise at least a first region and a second region, wherein the first poly-silicon islands formed in the first region have a first grain size and the first poly-silicon islands formed in the second region have a second grain size. The first grain size is different from the second grain size.

According to an embodiment of the present invention, the above method of forming the poly-silicon layer by using the laser beam to irradiate the amorphous silicon layer comprises the following steps. First, a laser beam is provided. The laser beam has a beam region of a width W. Then, the laser beam is used to irradiate the amorphous silicon layer to melt a part of the amorphous silicon layer. Next, the laser beam is moved a distance D1 relative to the amorphous silicon layer, wherein D1<0.5W, and the laser beam is used to irradiate the amorphous silicon layer. Afterwards, the laser beam is moved a distance D2 relative to the amorphous silicon layer, wherein D2≥0.5W, and the laser beam is used to irradiate the amorphous silicon layer. The above step of moving the laser beam the distance D1 relative to the amorphous silicon layer and using the laser beam to irradiate the amorphous silicon layer is performed, for example, for a plurality of times. In addition, the step of moving the laser the distance D1 relative to the amorphous silicon layer and using the laser to irradiate the amorphous silicon layer is performed substantially more times than the step of moving the laser beam the distance D2 relative to the amorphous silicon layer.

According to an embodiment of the present invention, the method of fabricating a TFT array substrate further comprises forming a plurality of sources and a plurality of drains, wherein each of the sources is electrically connected to each of the source regions of the poly-silicon islands and each of the drains is electrically connected to each of the drain regions of the poly-silicon islands. Additionally, the method of fabricating a TFT array substrate may also comprise further forming a dielectric layer to cover the gates and a gate insulating layer, after the sources and the drains are formed, wherein the gate insulating layer is disposed between the gates and the poly-silicon islands. The dielectric layer has a plurality of openings, and each of the sources is electrically connected to each of the corresponding source regions through the openings respectively and each of the drains is electrically connected to each of the corresponding drain regions through the openings respectively.

According to an embodiment of the present invention, the method of fabricating a TFT array substrate further comprises forming a plurality of pixel electrodes. Each of the pixel electrodes is electrically connected to each of the drains.

According to the above, in the TFT array substrate of the present invention, since the main grain boundaries of the first poly-silicon islands are only disposed within the source regions and the drain regions of the TFT and the channel regions of the TFT do not have main grain boundaries, the channel regions have high carrier mobility and the TFT has excellent device characteristics. Additionally, the TFT array substrate of the present invention and the method of fabricating thereof give consideration to both the carrier mobility in the channel layer of the TFT and the processing efficiency of the product.

In order to make the aforementioned and other objectives, features, and advantages of the present invention be more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 3A to 3F are views showing a method of fabricating a TFT array substrate according to an embodiment of the present invention.

FIG. 6B is a view showing a grain arrangement status of a poly-silicon film of a TFT after the poly-silicon film has crystallized according to the third embodiment of the present invention.

DESCRIPTION OF EMBODIMENTS

First Embodiment

Figure 1A:
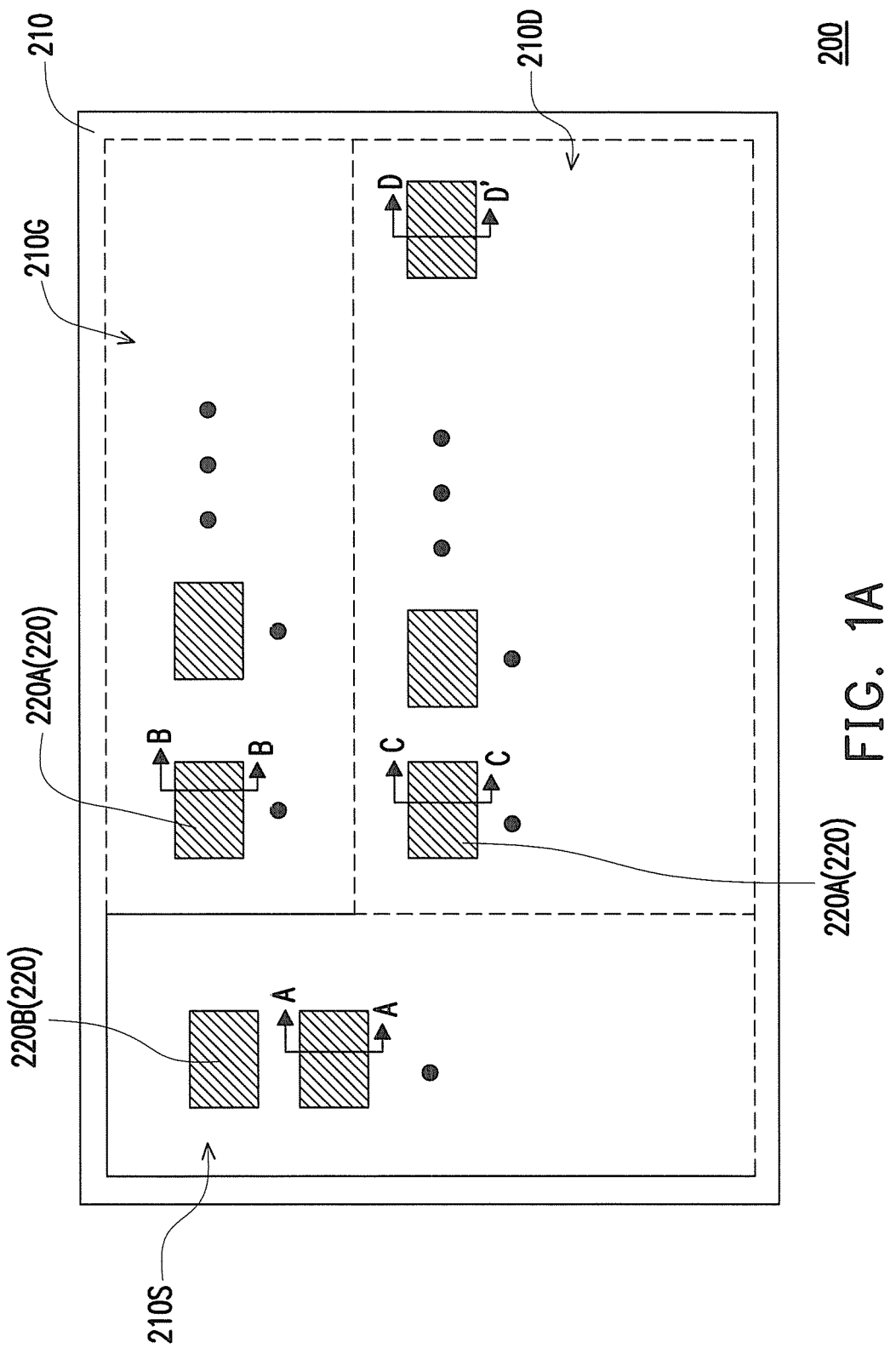
FIG. 1A is a schematic view showing a TFT array substrate according to an embodiment of the present invention.
Figure 1B:
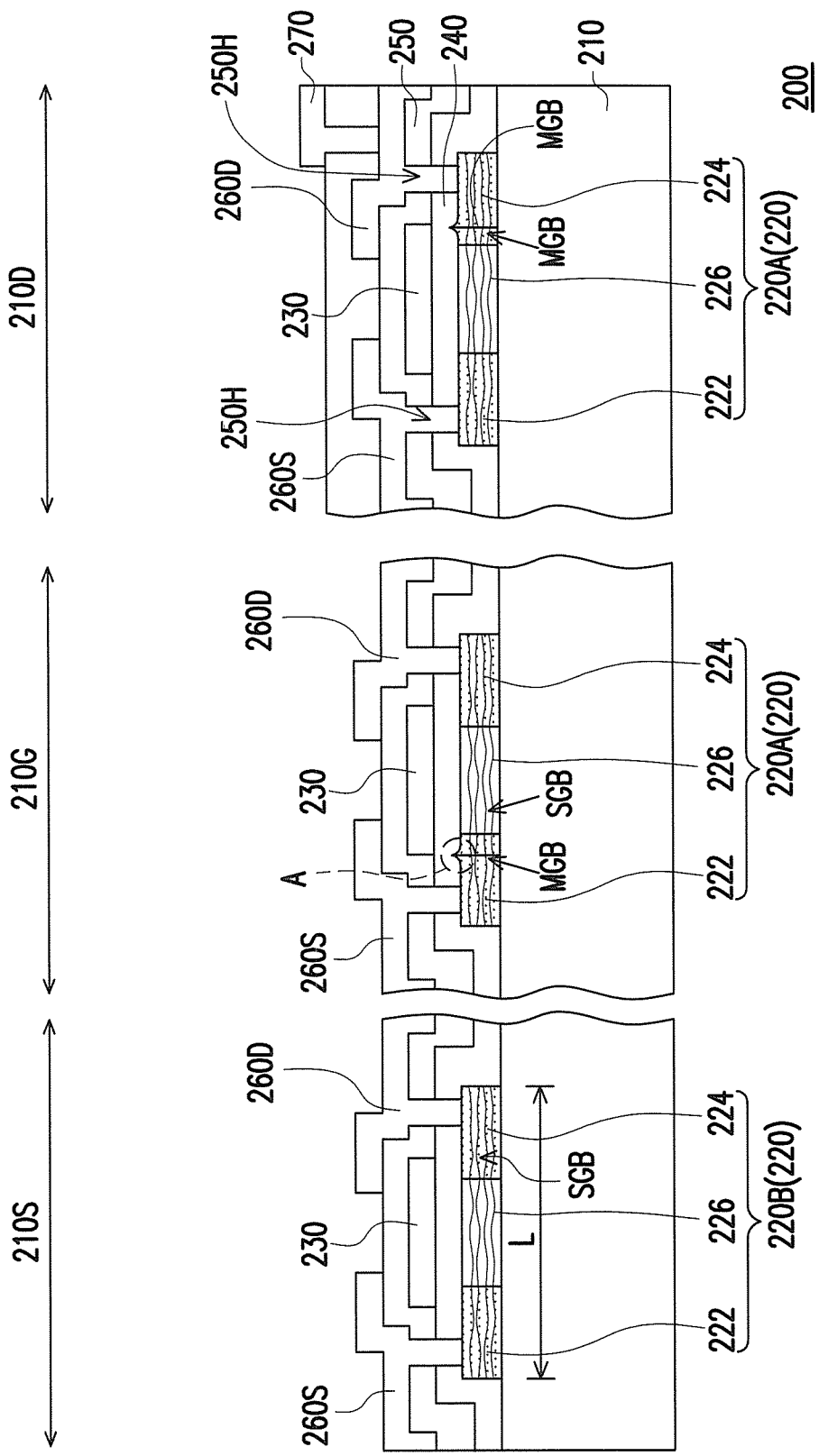
FIG. 1B are schematic cross-sectional views along lines AA, BB and CC of FIG. 1A.

FIG. 1A is a schematic view showing a TFT array substrate according to an embodiment of the present invention, and FIG. 1B are schematic cross-sectional views along lines AA, BB and CC of FIG. 1A. Referring to both FIGS. 1A and 1B, a TFT array substrate 200 comprises a substrate 210, a plurality of poly-silicon islands 220 and a plurality of gates 230 disposed on the substrate 210. The substrate 210 is mainly divided into a display region 210D, a gate driver region 210G and a source driver region 210S. The poly-silicon islands 220 comprise a plurality of first poly-silicon islands 220A and a plurality of second poly-silicon islands 220B. The first poly-silicon islands 220A are disposed in the display region (or namely active region) 210D and the gate driver region (or namely scan driver region) 210G, while the second poly-silicon islands 220B are disposed in the source driver region (or namely data driver region) 210S.

Continue referring to FIG. 1B, each of the poly-silicon islands 220A and 220B comprises a source region 222, a drain region 224, and a channel region 226 disposed between the source region 222 and the drain region 224. The first poly-silicon islands 220A have main grain boundaries MGB and sub grain boundaries SGB, and the main grain boundaries MGB of the first poly-silicon islands 220A are only disposed within the source regions 222 and/or the drain regions 224 (such as within at lest one of the source regions 222 and the drain regions 224). The second poly-silicon islands 220B are disposed in the gate driver region 210S, wherein grain sizes of the first poly-silicon islands 220A are substantially different from grain sizes of the second poly-silicon islands. Gates 230 are disposed on the substrate 210, and according to the present embodiment, the gates 230 are disposed correspondingly above the channel region 226. Gate insulating layers 240 are disposed between the gates 230 and the poly-silicon layers 220A and 220B. According to the present embodiment, the gates 230, the channel regions 226, the source regions 222 and the drain regions 224 form top gate TFTs. In other embodiments, the gates 230 may also be disposed correspondingly beneath the channel regions 226 to form bottom gate TFTs. The present invention is not limited to these embodiments.

In addition, the TFT array substrate 200 selectively covers the gates 230 and the gate insulating layer 240 with a dielectric layer 250, wherein the dielectric layer 250 comprises, for example, a plurality of openings 250H exposing a part of the source regions 222 or a part of the drain regions 224. A plurality of sources 260S and a plurality of drains 260D are selectively disposed on the dielectric layer 250, wherein each of the sources 260S is electrically connected to each of the source regions 222 of the poly-silicon islands 220 through the corresponding openings 250H and each of the drains 260D is electrically connected to each of the drain regions 224 of the poly-silicon islands 220 through the corresponding openings 250H. According to the present invention, the TFT array substrate 200 further comprises a plurality of pixel electrodes 270. Each of the pixel electrodes 270 is electrically connected to each of the drains 260D.

Particularly, referring to FIG. 1B, the main grain boundaries of the first poly-silicon islands 220A are only disposed within the source regions 222 and/or the drain regions 224. In other words, in the channel regions 226 of the first silicon islands 220A, the boundaries between grains are mainly the sub grain boundaries SGB, and there is no main grain boundary MGB. It should be noted that, the so called main grain boundaries MGB are protrusions formed on surfaces of the poly-silicon islands during a process in which grains grow, for example, as A in FIG. 1B. The sub grain boundaries are mostly concaves on the surfaces of the poly-silicon islands. Therefore, when the TFTs with the first poly-silicon islands 220A are turned on, carriers in the channel regions 226 move smoothly in the regions without being trapped in defects in the main grain boundaries. Hence, the TFT with the first poly-silicon islands 220A of the present invention have high carrier mobility, so that TFTs used as switches of display units in the display area 210D have better display quality, and driving efficiencies of TFTs used as gate driver circuits in the gate driver region 210G are increased.

On the other hand, in order to enhance productivity of the TFT array substrate 200, when a layout design of TFTs on the substrate 210 is designed by a designer, the main grain boundaries MGB of the first poly-silicon islands 220A are selectively disposed only in the source regions 222 and/or the drain regions 224 by using crystallization processes of the poly-silicon layer 220. Thus, the yield of the TFT array substrate 200 is substantially increased. A process of fabricating the TFT array substrate 200 is illustrated Later. Furthermore, carriers mobility in the source regions and the drain regions 224 is mainly determined by dopant concentrations in the poly-silicon layer, so the presence of the main grain boundaries MGB in the source regions 222 and the drain region 224 hardly affects device characteristics of the TFT. Therefore, compared with a conventional method, the TFT array substrate 200 of the present invention not only has TFTs of high carrier mobility in the display region 210D and the gate driver region 210G, the total times of moving the substrate and irradiation with a laser beam are decreased, so that the yield is significantly increased.

It should be noted that, according to the present embodiment, the second poly-silicon islands 220B substantially have only sub grain boundaries SGB, which means that the source regions 222, the drain regions 224, and the channel regions 226 have only sub grain boundaries SGB. In other words, the second poly-silicon islands 220B do not have a main grain boundary MGB, and the grain sizes of the second poly-silicon islands are about lengths along a direction of the channel. According to the present invention, the grain sizes of the second poly-silicon islands 220B are substantially larger than the grain sizes of the first poly-silicon film. Therefore, for the TFTs in the source driver region 210S, the second poly-silicon islands 220B without a main grain boundary MGB provide a conductive path of extremely low resistance for the carriers, so that the carriers move smoothly in the channel regions 226. This is beneficial for enhancing the device characteristics of the TFTs, especially the TFTs used as source driver circuits. The poly-silicon film layer without a main grain boundary MGB can transmit predetermined data voltages rapidly to the plurality of source regions corresponding to the display region 210D, within a shorter time when the TFT are turned on. As a result, the display quality of the display region 210D is enhanced.

Figure 2:
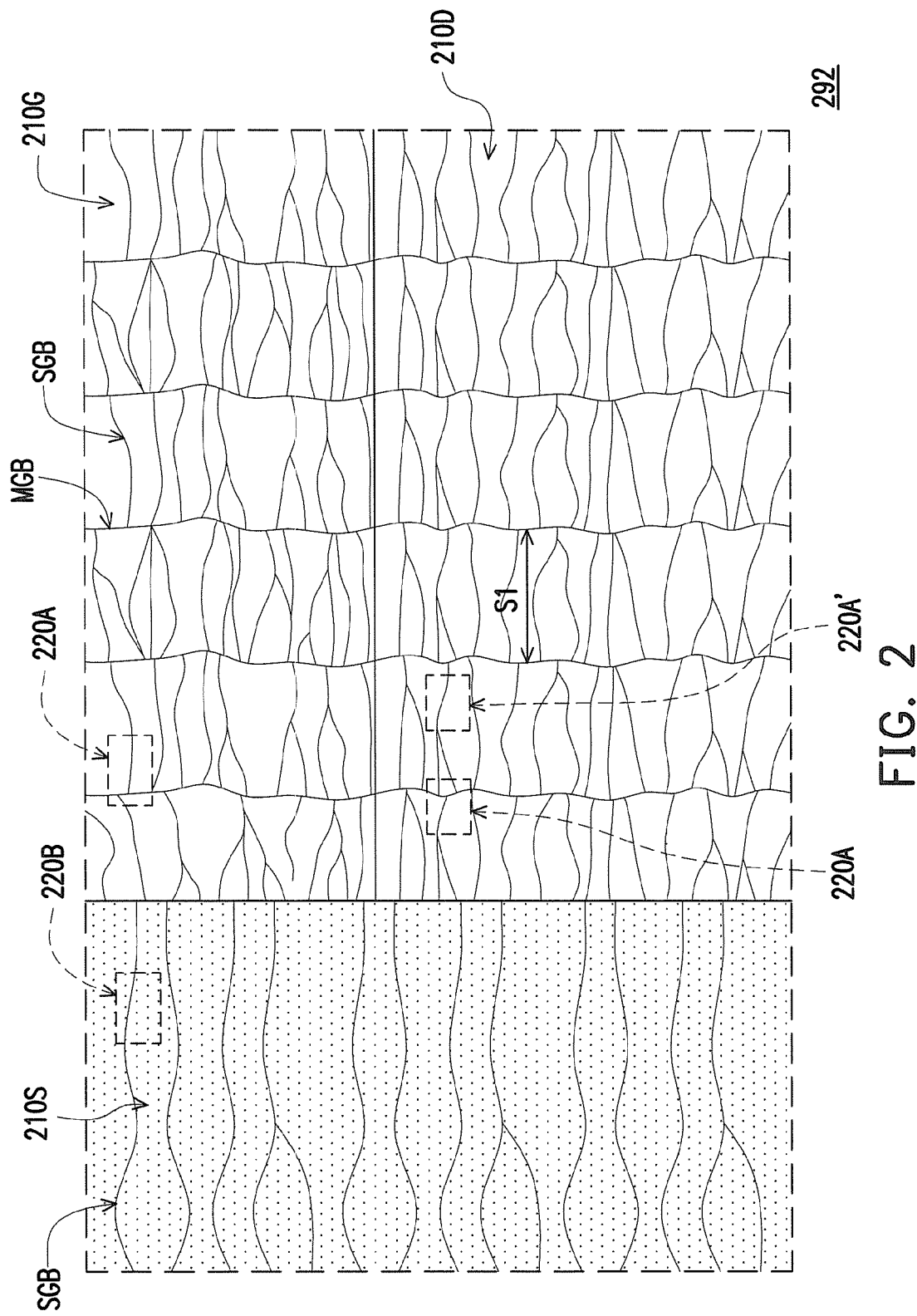
FIG. 2 is a view showing a grain arrangement status after a poly-silicon film of a TFT has crystallized according to the first embodiment of the present invention.

In order to clearly illustrate grain arrangement statuses of the first poly-silicon islands 220A and the second poly-silicon islands 220B on the substrate 210, FIG. 2 is a view showing a grain arrangement status after a poly-silicon film 292 of the TFT has crystallized according to the first embodiment of the present invention. Referring to FIG. 2, the poly-silicon film 292 in the source driver circuit predetermined to form the second poly-silicon islands 220B does not have a main grain boundary MGB, so after the poly-silicon islands in the region 220 are patterned, referring to FIGS. 1A & 1B, the second poly-silicon islands 220B without a main grain boundary MGB are formed. Referring to FIG. 2, in the display region 210D and the gate driver region 210G, the main grain boundaries MGB of the poly-silicon film predetermined to form the first poly-silicon islands are arranged periodically with distances S1. If positions on the substrate 210 in which the TFTs are formed are properly deployed, after the poly-silicon islands 220 in the display region 210D and the gate driver region 210G are patterned, the first poly-silicon islands 220A wherein the main grain boundaries MGB are only disposed within the source regions 222 and/or the drain regions 224 are formed. Of course, a part of the first poly-silicon islands may not have a main grain boundaries, such as in the marked predetermined forming position of the first poly-silicon islands 220A' in the display region. The present invention is not limited to the present embodiment.

The following uses the TFT array substrate 200 of FIGS. 1A and 1B as an example, in conjunction with the view showing the grain arrangement status of the poly-silicon film of FIG. 2, to illustrate in an example a method of fabricating the TFT array substrate 200. FIGS. 3A to 3F are views showing a method of fabricating a TFT array substrate according to an embodiment of the present invention.

Figure 3A:
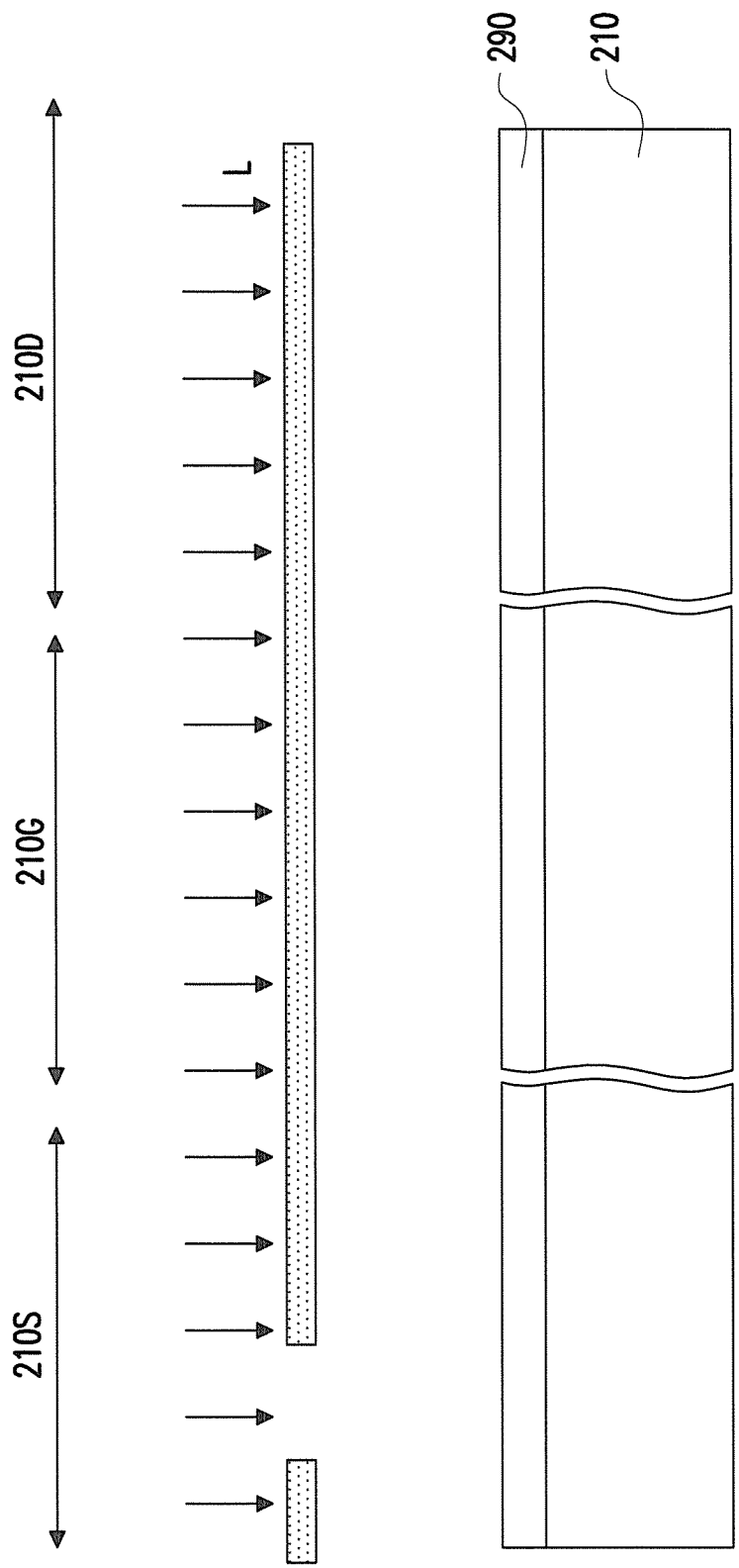

Referring to FIG. 3A, first the substrate 210 is provided. The substrate comprises the display region 210D, the gate driver region 210G, and the source driver region 210S. Then, the amorphous silicon layer 290 is formed on the substrate 210. Next, a laser beam L is used to irradiate the amorphous silicon layer 290. Afterwards, referring to FIG. 3B, the poly-silicon layer 292 is formed. A top view of the poly-silicon layer 292 is shown in FIG. 2. Referring to both FIGS. 2 and 3B, the poly-silicon layer 292 has a plurality of main grain boundaries MGB and a plurality of sub grain boundaries SGB. Grain sizes S1 of the poly-silicon layer 292 disposed in the display region 210D and the gate driver region 210G are substantially different from grain sizes S2 of the poly-silicon layer 292 disposed in the source driving region 210S. According to the present embodiment, the poly-silicon layer 292 formed in the source driving region 210S has only sub grain boundaries SGB but no main grain boundaries MGB. In addition, the grain sizes S2 of second poly-silicon islands 220B are substantially larger than the grain sizes S1 of the first poly-silicon islands 220A.

Afterwards, referring to FIG. 3C, after the poly-silicon layer 292 is patterned, a plurality of poly-silicon islands 220 are formed, wherein the poly-silicon islands 220 disposed in the display region 210D and the gate driver region 210G form the plurality of first poly-silicon islands 220A, and the poly-silicon islands 220 disposed in the source driver region 210S form the plurality of second poly-silicon islands 220B.

Figure 3D:
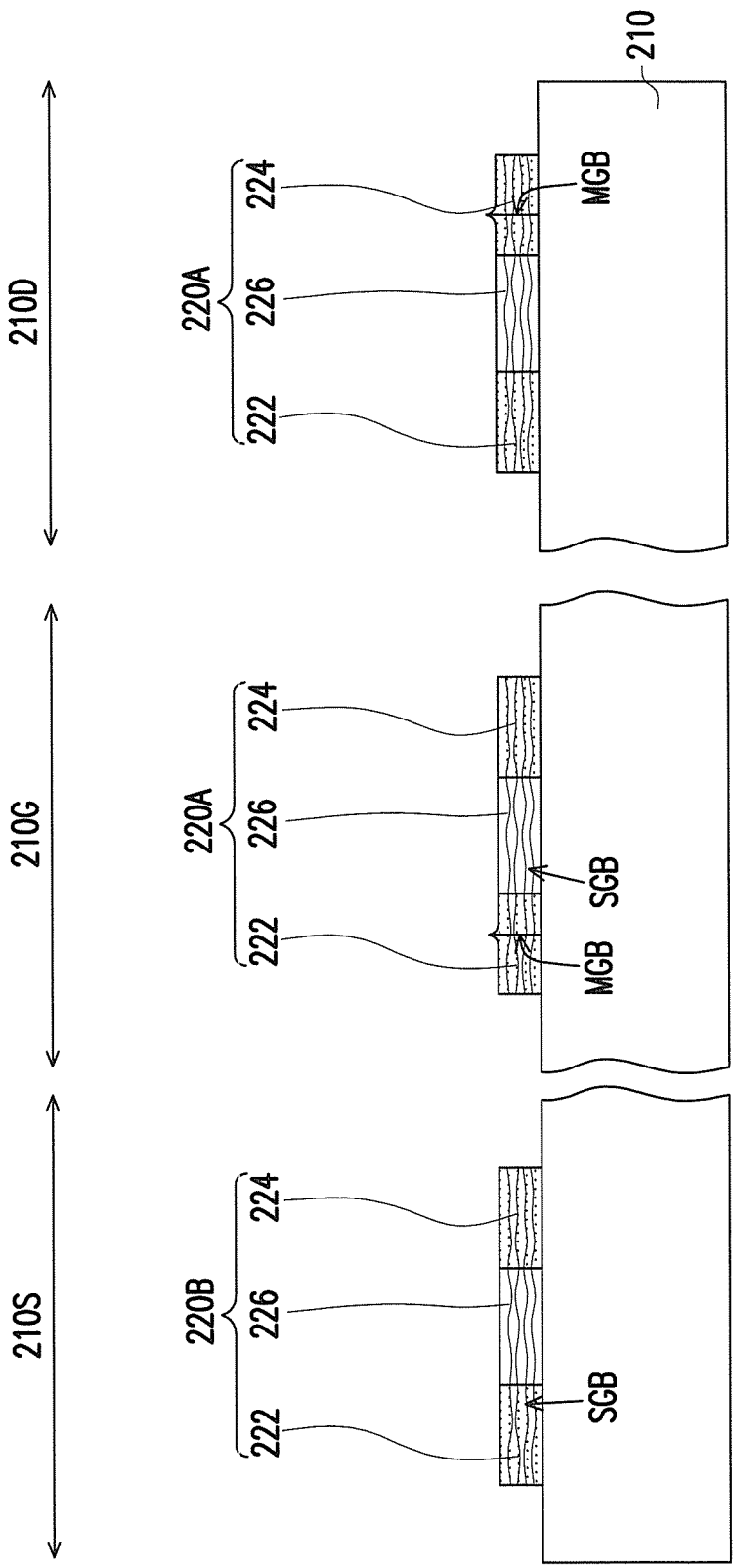

Afterwards, referring to FIG. 3D, in each of the first poly-silicon islands 220A and each of the second poly-silicon islands 220B, the source region 222, the drain region 224, and the channel region 226 disposed between the source region 222 and the drain region 224 are defined, so that the main grain boundary MGB of each of the first poly-silicon islands 220A is only disposed within the source region and/or the drain region 224 of each of the first poly-silicon islands 220A. The above method of defining the source regions 222, the drain regions 224, and the channel regions 226 is, for example, performing an ion doping process. The ion doping process uses, for example, a patterning photoresist layer (not shown) that exposes the source regions 222 and the drain regions 224 as a mask, while the channel regions 226 are not exposed by the patterning photoresist layer (not shown). A implanting process wherein high energy ions impact the poly-silicon surface is performed, and by removing the patterning photoresist layer, the source regions 222, the drain regions 224 and the channel regions 226 disposed between the source regions 222 and the drain regions 224 are formed.

Figure 3E:
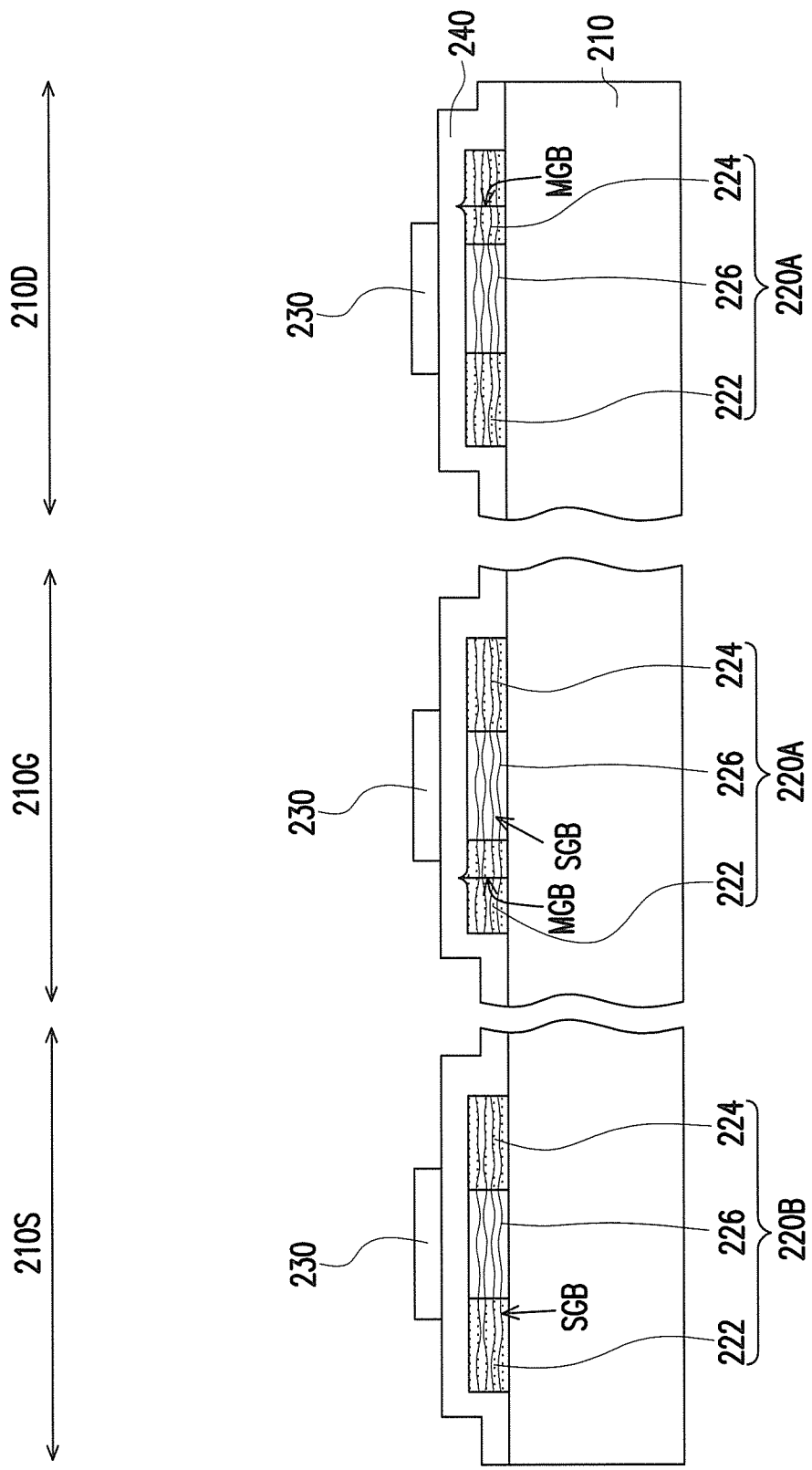

Then, referring to FIG. 3E, the gate insulating layer 240 is covered on the first poly-silicon islands 220A and the second poly-silicon islands 220B. The gate insulating layer 240 is formed by, for example, a chemical vapor deposition (CVD) method or other suitable thin film deposition methods. The gate insulating layer 240 has a single layer or multiple layer structure, and is made of materials such as silicon oxide, silicon nitride, silicon oxynitride, photoresist, benzocyclobutene, cycloolefines, polyimides, polyamides, polyesters, polyols, polyoxiranes, polyphenols, resins, polyethers, polyketones, dielectric materials as such, other suitable materials, or any combinations of the above. In addition, the plurality of gates 230 are formed correspondingly above the channel regions 226, so that the gates 230, the channel regions 226, the source regions 222 and the drain regions 224 form TFTs. The gates 230 are formed by, for example, sputtering, evaporation or other thin film deposition techniques. The gates 230 have single layer or multiple layer structures, and are made of materials such as aluminum, molybdenum, titanium, neodymium, nitrides of the above such as molybdenum nitride, titanium nitride, stackings of the above, alloys of the above or other conductive material.

Figure 3F:
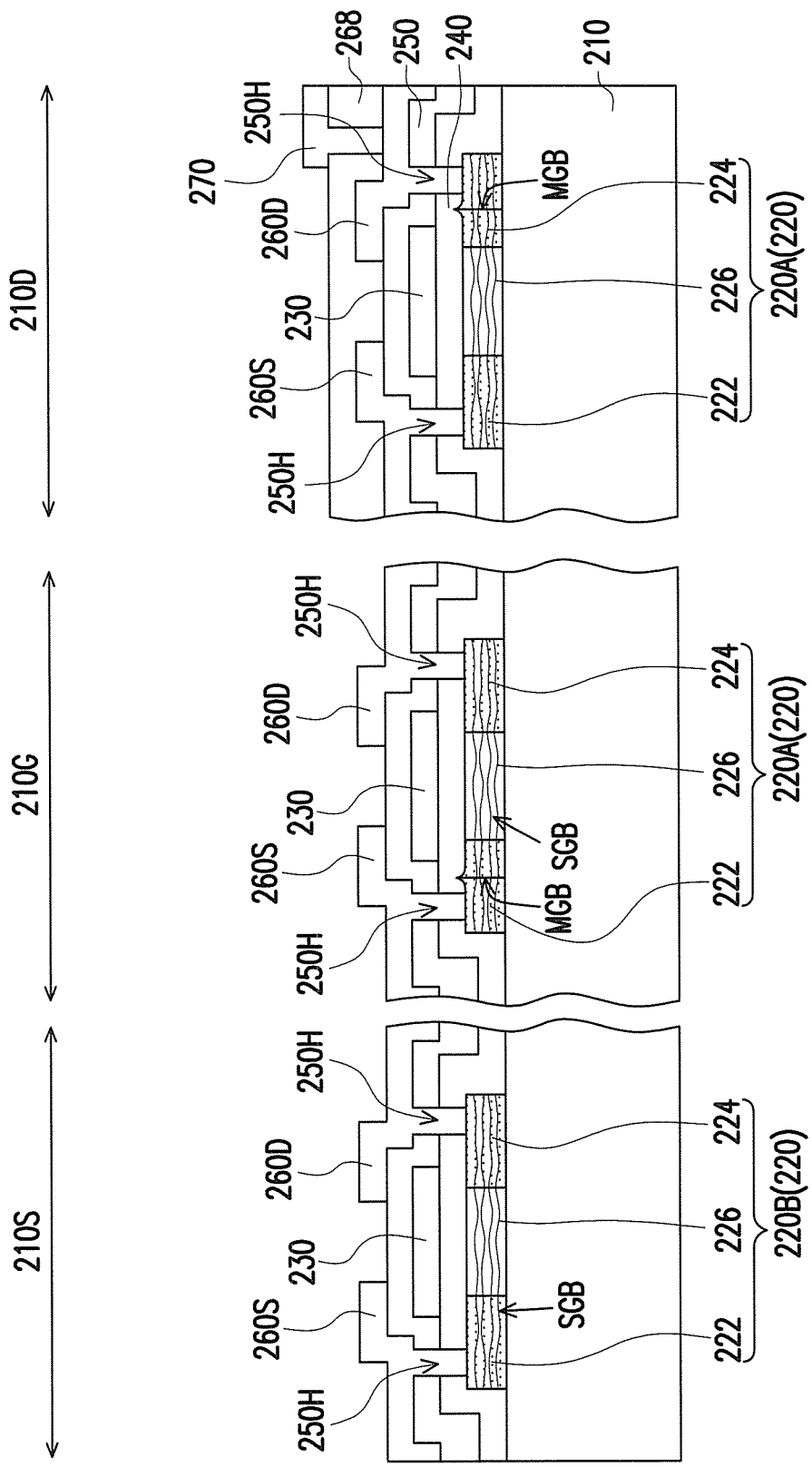

Then, referring to FIG. 3F, according to the present embodiment, the dielectric layer 250 is selectively formed on the TFTs to cover the gates 230 and the gate insulating layer 240. The dielectric layer 250 is also patterned, so that there are a plurality of openings 250H in the dielectric layer 250. Next, the sources 260S and the drains 260D are selectively formed on the dielectric layer 250, so that each of the sources 260S is electrically connected to each of the source regions 222 of the poly-silicon islands 220 through the corresponding opening 250H and each of the drains 260D is electrically connected to each of the drain region 224 of the poly-silicon islands 220 through the corresponding opening 250H. Then, according to the present embodiment, a protective layer 268 that exposes the drain 260D is further selectively formed in the display region 210D, and a pixel electrode 270 electrically connected to the drains 260D is formed on the protective layer 268. It must be noted that, according to the fabricating flowcharts in FIGS. 3A to 3F of the present embodiment, the gates 230, the channel regions 226, the source regions 222 and the drain regions 224 form top gate TFTs. In other embodiments, the gates 230 may also be correspondingly disposed beneath the channel regions 226 to form bottom gate TFTs, wherein the gate insulating layer 240, is disposed between the gates 230 and the first poly-silicon islands 220A and disposed between the gates 230 and the second poly-silicon islands 220B, and covers the first poly-silicon islands 220A and the second poly-silicon islands 220B. The present invention is not limited to these embodiments.

Figure 4A:
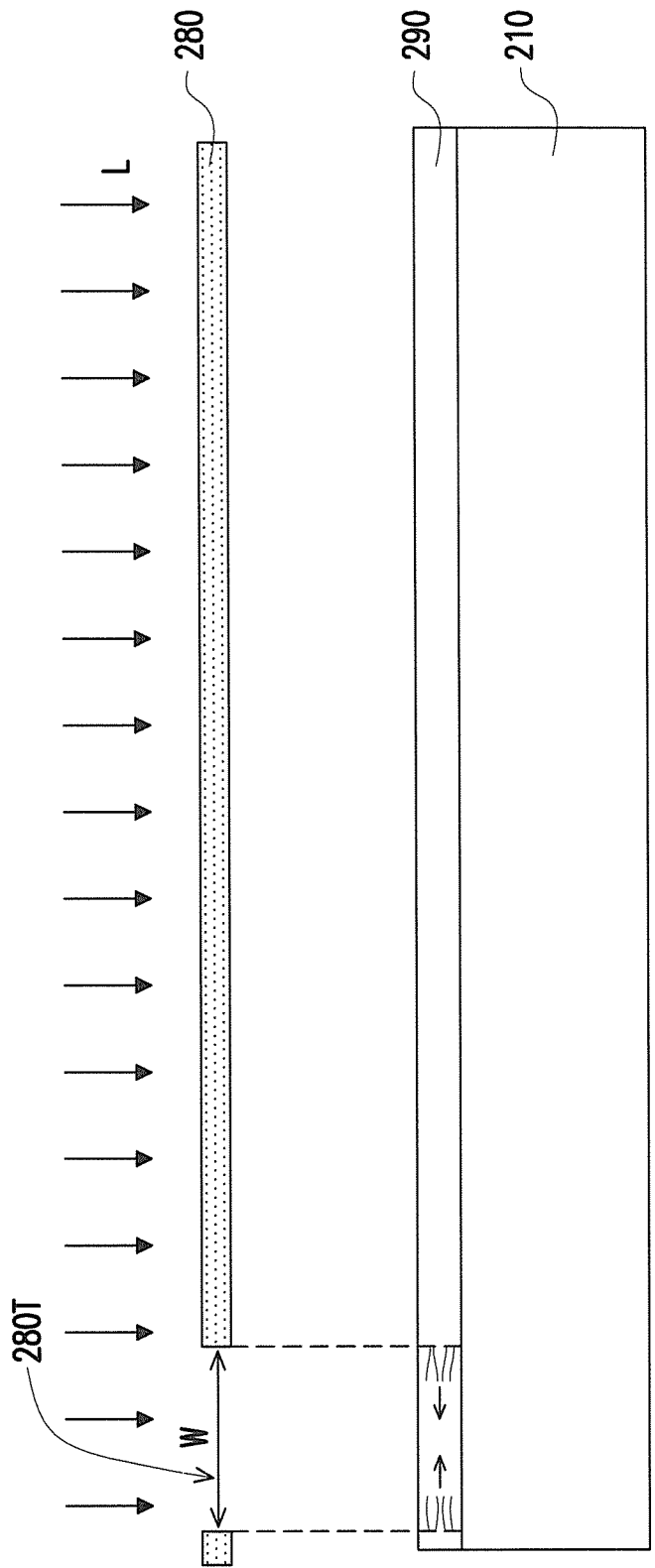
FIGS. 4A to 4D are views showing a method of forming a poly-silicon layer by using a laser beam L to irradiate an amorphous silicon layer in the present invention.

In further detail, FIGS. 4A to 4D are views showing a method of forming a poly-silicon layer by using a laser beam L to irradiate an amorphous silicon layer of the present invention. Referring to FIG. 4A, the method comprises, for example, the following steps. First, a photomask 280 is provided, wherein the photomask 280 has a transparent region 280T with a width W. The laser beam L is used to irradiate the amorphous silicon layer 290 through the transparent region 280T, so that the amorphous silicon layer 290 irradiated with the laser beam L melts. The melted amorphous silicon layer 290 uses solid amorphous silicon on the two sides of the irradiated region as seeds and grows from the two sides of the irradiated region to the center.

Figure 4B:
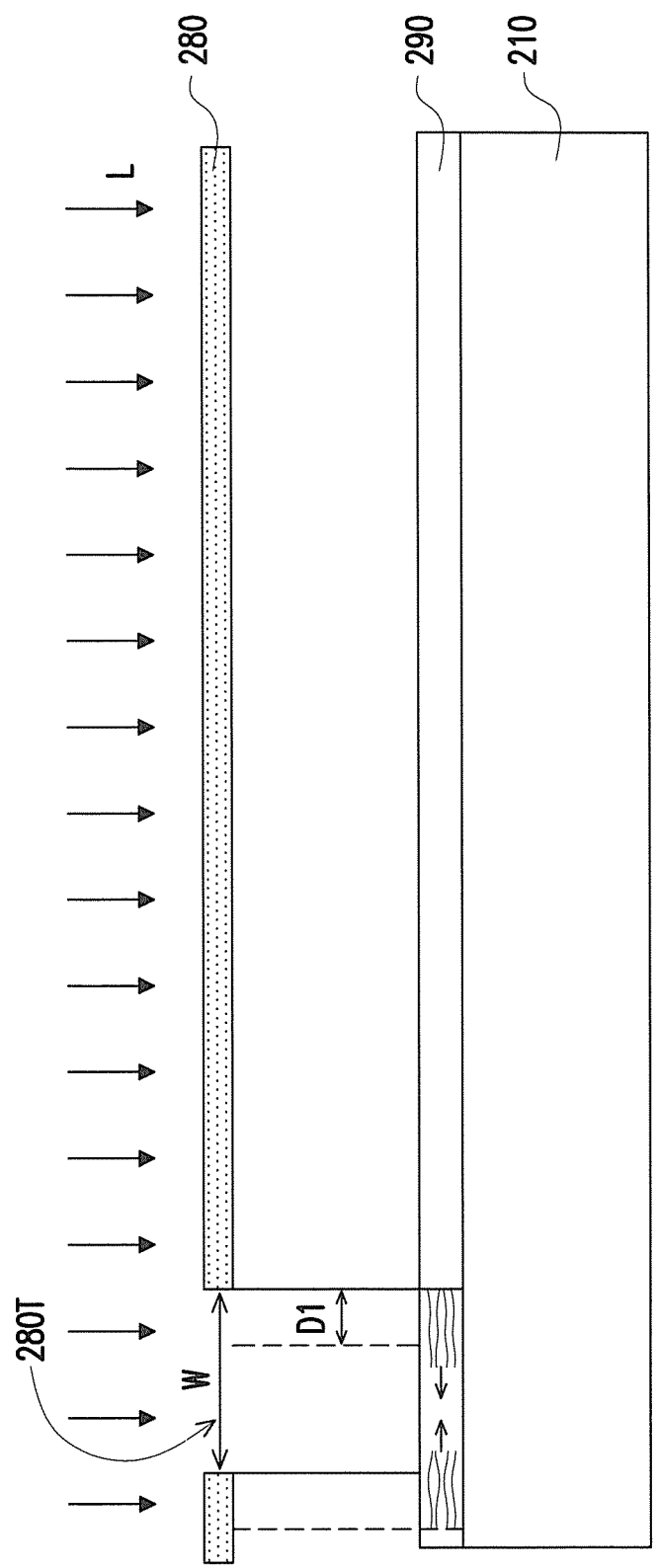

Then, as in step (A) in FIG. 4B, the photomask 280 is moved a distance D1 relative to the amorphous silicon layer 290, wherein D1<0.5W. Next, the laser beam L is used to irradiate the amorphous silicon layer 290 through the transparent region 280T. Performing step (A) causes the region irradiated with the laser beam L to continue growing transversely along poly-silicon grains already grown. By performing step (A) repeatedly, the grains are able to continuously grow without forming the main grain boundary MGB. Situations in which the photomask 280 moves relatively to the amorphous silicon layer 290 include: a situation wherein the photomask 280 is moved while the amorphous silicon layer 290 is not moved, a situation wherein the photomask 280 is not moved while the amorphous silicon layer 290 is moved, or a situation wherein the photomask 280 is moved in a direction while the amorphous silicon layer is moved in another direction, and the two directions are different. The embodiment of the present invention exemplifies a situation in which the photomask 280 is moved while the amorphous silicon layer 290 is not moved, but the present invention is not limited to this embodiment.

Figure 4C:
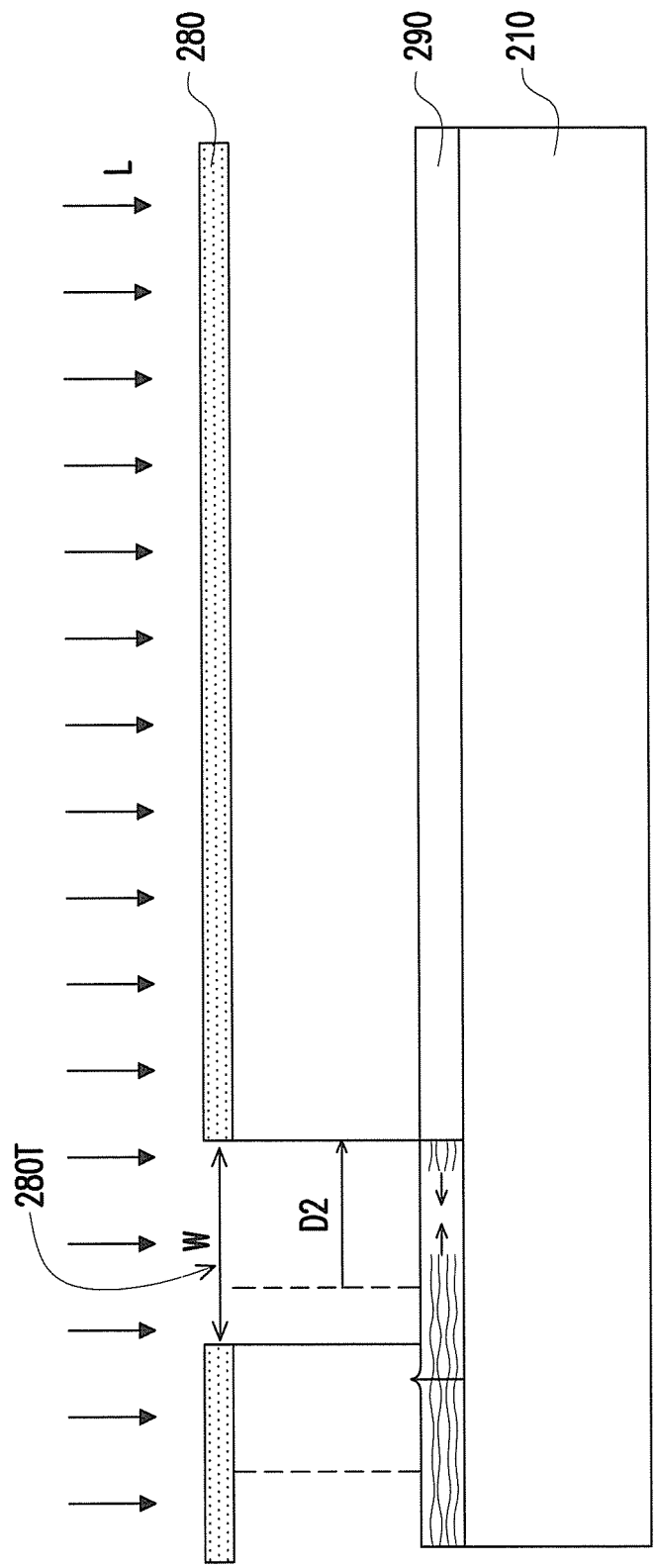

Then, as in step (B) in FIG. 4C, the photomask 280 is moved a distance D2 relative to the amorphous silicon layer 290, wherein D2≥0.5W. Next, the laser beam L is used to irradiate the amorphous silicon layer 290 through the transparent region 280T. Since an amount of relative movement between the photomask 280 and the amorphous silicon layer 290 is substantially larger than half width W of the transparent region 280T, when step (B) is performed, the main grain boundary MGB is formed in the center of the irradiated region on the amorphous silicon layer 290 in the previous time.

Figure 4D:
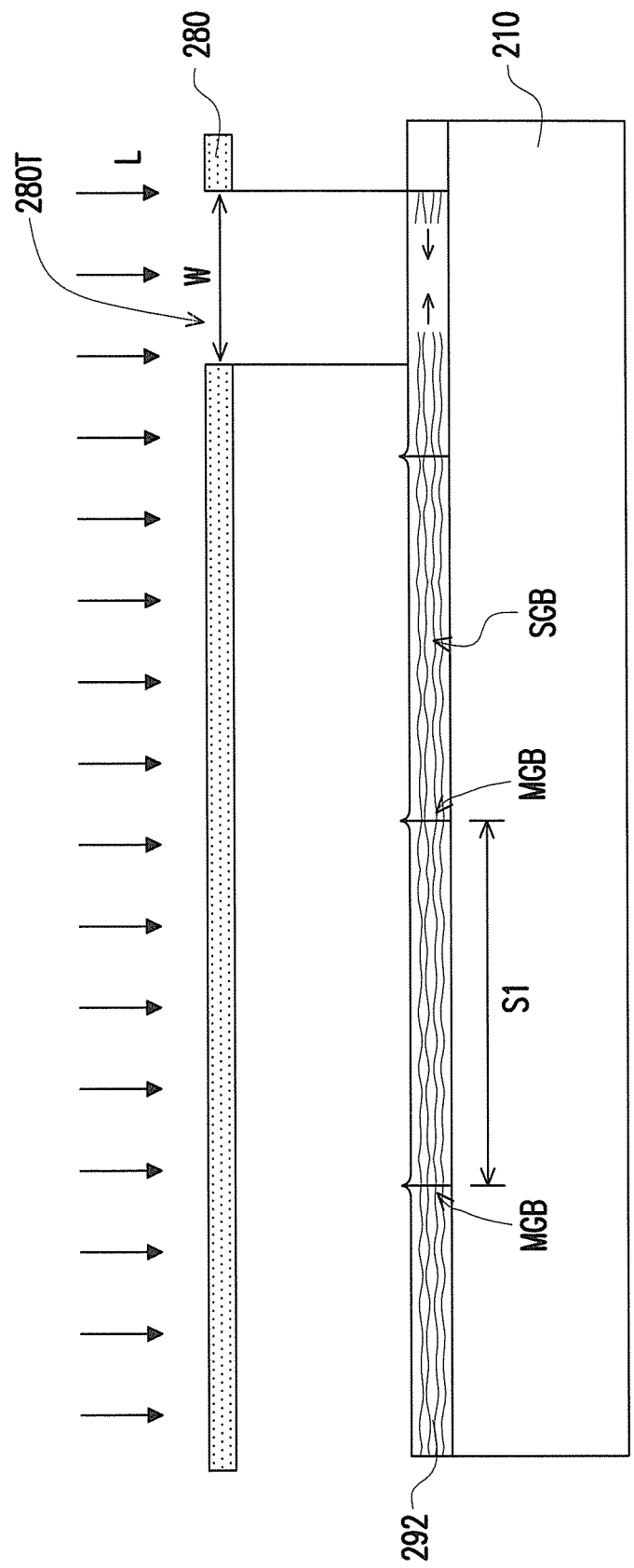

Next, referring to FIG. 4D, step (A) is performed for m times, and step (B) is performed once subsequently. The procedure of performing step (A) for m times and performing step (B) once subsequently is operated several times to form the poly-silicon layer 290 that has the main grain boundaries MGB which are arranged periodically with the distances S1, and the distances S1 between two adjacent main grain boundaries are generally defined as the grain sizes S1 of the poly-silicon layer 292.

It should be noted that, the above method of crystallizing the amorphous silicon layer may also not use the photomask, but uses instead narrowing the width of the laser beam parallel to the moving direction, and extending the length of the laser beam perpendicular to the moving direction to achieve the same purpose. In other words, a method of not using the photomask to fabricate the poly-silicon comprises: (A) providing a laser beam that has a beam region of a width W; (B) Using the laser beam to irradiate the amorphous silicon layer to melt a part of the amorphous silicon layer; (C) moving the laser beam a distance D1 relative to the amorphous silicon layer, wherein D1<0.5W, and using the laser beam to irradiate the amorphous silicon layer; and (D) moving the laser beam a distance D2 relative to the amorphous silicon layer, wherein D2≥0.5W, and using the laser beam to irradiate the amorphous silicon layer. Other steps or detailed steps are the same as that when using the photomask, so repeated description is omitted. It must be noted that, the size of the beam region of the laser beam is substantially the same as the size of the above transparent region 280T of the photomask when it is required.

In practice, according to a size of the substrate and a size of the TFT and a predetermined position of formation, step (A) is performed repeatedly so that the grains grow without forming the main grain boundaries MGB. According to the predetermined position of formation of the main grain boundaries MGB, step (B) is duly performed to control the formation of the main grain boundaries MGB on the poly-silicon layer 292 and shorten the processing time. For example, according to the present embodiment, in the step of converting the amorphous silicon layer 290 in the source driver region 210S into the poly-silicon layer 292, step (A) is performed repeatedly, for example, so that the poly-silicon layer 292 in the source driver region 210S has only sub grain boundaries SGB but no main grain boundaries MGB. On the other hand, in the step of converting the amorphous silicon layer 290 in the display region 210D and the gate driver region 210G into the poly-silicon layer 292, for example, step (A) is performed repeatedly for m times and step (B) is performed once subsequently, and the procedure of performing step (A) for m times and performing step (B) once subsequently is operated several times to form the poly-silicon layer 292 that has the main grain boundaries MGB which are arranged periodically with the distances S1.

According to product resolution, product size, productivity or other demands, the user chooses the above appropriate steps of crystallizing poly-silicon, so that the main grain boundaries MGB of the first poly-silicon islands 220A is only disposed within the source regions 222 and/or the drain regions 224. Therefore, not only are TFTs of high carrier mobility obtained, processing efficiency of the TFT array substrate is enhanced on the other hand. The following further presents a few kinds of the TFT array substrates 200 of the present invention, and uses other views showing grain arrangement statuses of poly-silicon films after crystallization on the TFT according to different embodiments of the present invention, so that crystal structures of the poly-silicon on the different substrates 210 are clearly illustrated.

Second Embodiment

Figure 5A:
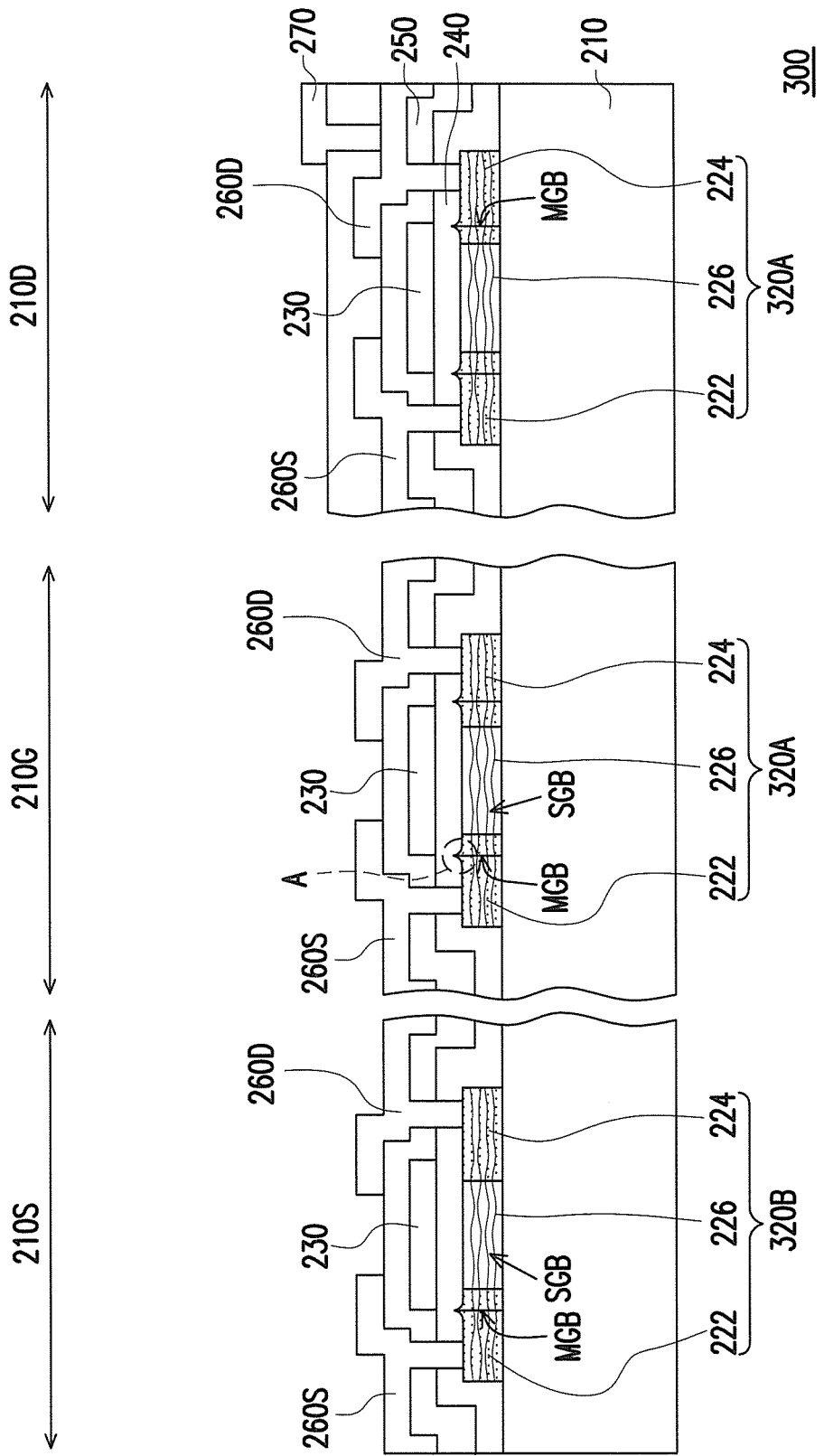
FIG. 5A are schematic cross-sectional views along lines AA, BB and CC of FIG. 1A of a TFT array substrate according to the second embodiment of the present invention.

FIG. 5A are schematic cross-sectional views along lines AA, BB and CC of FIG. 1A of a TFT array substrate according to the second embodiment of the present invention. Referring to FIG. 5A, in order to illustrate simply, similar components mentioned above are not illustrated repeatedly. Compared with the previous embodiment, second poly-silicon islands 320B on a TFT array substrate 300 of the present embodiment have main grain boundaries MGB and sub grain boundaries SGB, and the main grain boundaries MGB of the second poly-silicon islands 320B are disposed only in the source region 222 and/or the drain region 224 (such as in at least one of the source region 222 and the drain region 224). In other words, there are no main grain boundaries MGB in the channel regions 226 of the second poly-silicon islands 320B. The positions of formation of the main grain boundaries MGB and the sub grain boundaries SGB of the second poly-silicon islands 320B are controlled by changing the aforementioned scan pitches. In addition, according to the present embodiment, grain sizes of the second poly-silicon islands 320B on the TFT array substrate 300 are substantially larger than grain sizes of the first poly-silicon islands.

Figure 5B:
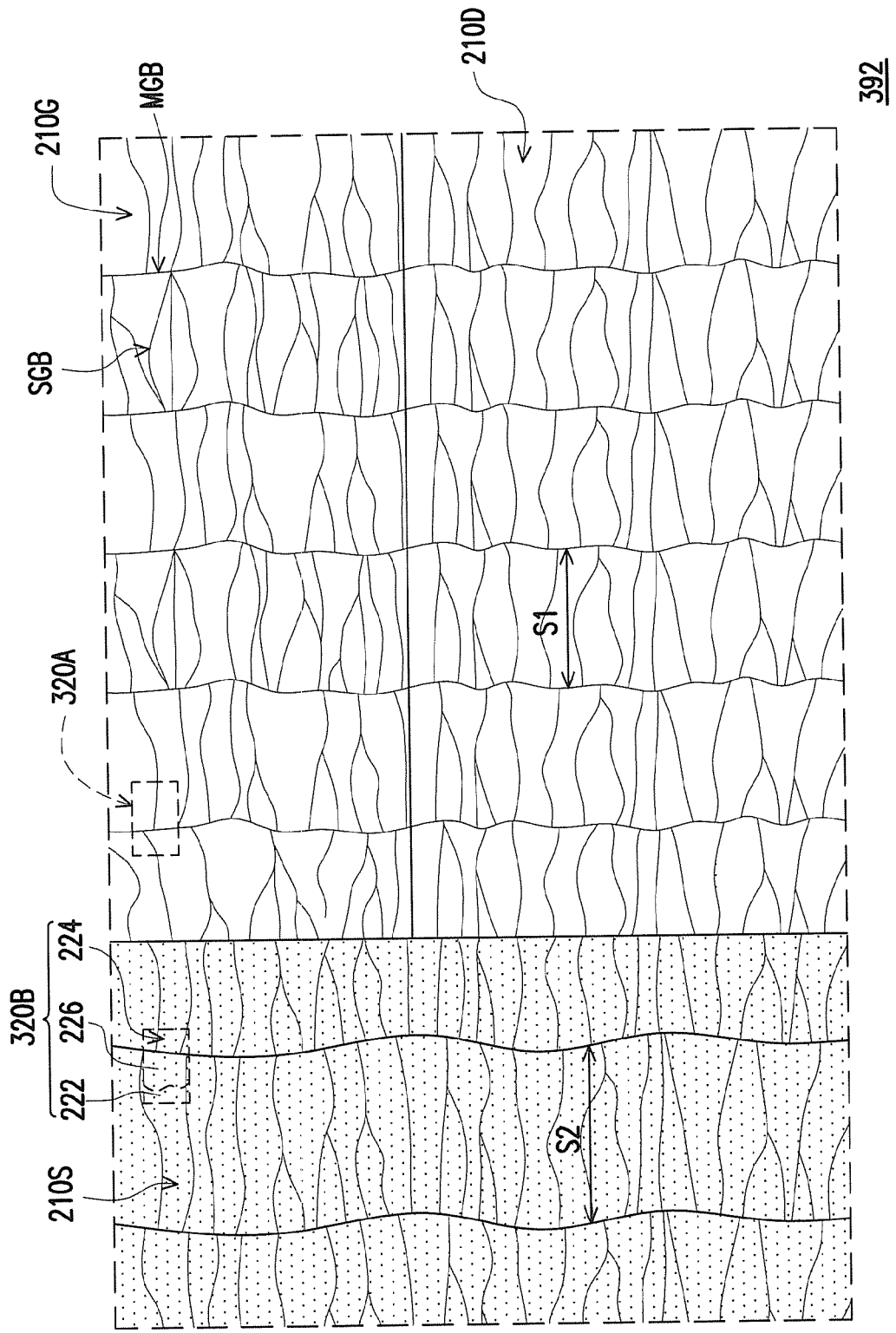
FIG. 5B is a view showing a grain arrangement status of a poly-silicon film of a TFT after the poly-silicon film has crystallized according to the second embodiment of the present invention.

FIG. 5B is a view showing a grain arrangement status of a poly-silicon film of a TFT after the poly-silicon film has crystallized according to the second embodiment of the present invention. Referring to FIG. 5B, in the source driver region 210S, the poly-silicon film predetermined to form the second poly-silicon islands has main grain boundaries MGB and sub grain boundaries SGB, so that after the poly-silicon islands in the region are patterned, referring to FIG. 5A, a manner, in which the main grain boundaries MGB and the sub grain boundaries SGB are only disposed within the source regions 222 and/or the drain regions 224 of the second poly-silicon islands 320B, is formed. The main grain boundaries MGB of the second poly-silicon islands 320B are arranged periodically with distances S2. Referring to FIG. 5A, in the display region 210D and the gate driver region 210G, the main grain boundaries MGB of the poly-silicon film predetermined to form of the first poly-silicon islands 320A, are arranged periodically with the distances S1, wherein S2>S1. Therefore, by properly deploying the positions of formation of the TFTs on the substrate 210, after patterning the polysilicon islands in the region, the first poly-silicon islands 320A that have the main grain boundaries MGB disposed only in the source regions 222 and/or the drain regions 224 and the second poly-silicon islands 320B that have the main grain boundaries MGB disposed only in the source region 222 and/or the drain region 224 are formed.

When using the above mentioned method of fabricating the poly-silicon layer 392 by using the laser beam L to irradiate the amorphous silicon layer 290, as in FIG. 5B according to the present embodiment, step (A) is performed for n times, and step (B) is performed once subsequently. The procedure of performing step (A) for n times and performing step (B) once subsequently is operated several times to form the poly-silicon layer 392 that has the main grain boundaries MGB which are arranged periodically with the distances S2, so that after subsequent patterning processes, the poly-silicon layer 392 in the region forms the second poly-silicon islands 320B, as in FIG. 5A, wherein the main grain boundaries MGB of the second poly-silicon islands 320B are disposed only within the source regions 222 and/or the drain regions 224. Therefore, productivity of the TFTs is enhanced and the TFTs of excellent device characteristics are obtained. On the other hand, in the display region 210D and the gate driver region 210G, in the step of converting the amorphous silicon layer 390 into the poly-silicon layer 392, for example, step (A) is performed for m times, and step (B) is performed once subsequently. The procedure of performing step (A) for m times and performing step (B) once subsequently is operated several times to form the poly-silicon layer 392 that has the main grain boundaries MGB which are arranged periodically with the distances S1, so that after subsequent patterning processes, the poly-silicon layer 392 in the region forms the first poly-silicon islands 220A, as in FIG. 5B, wherein the main grain boundaries MGB of the first poly-silicon islands 220A are only disposed within the source regions 222 and/or the drain regions 224 (such as within at least one of the source regions 222 and the drain regions 224). In addition, according to the present embodiment, in the above step of crystallizing the poly-silicon layer 392, n>m, so that after the poly-silicon layer 392 is crystallized, the distances S2 between the main grain boundaries of the second poly-silicon islands 320B are greater than the distances S1 between the main grain boundaries of the first poly-silicon islands 320A, which is able to be represented as S2>S1. Hence, after the poly-silicon layer 392 is patterned, the grain sizes of the second poly-silicon islands 320B are substantially larger than the grain sizes of the first poly-silicon film.

Third Embodiment

Figure 6A:
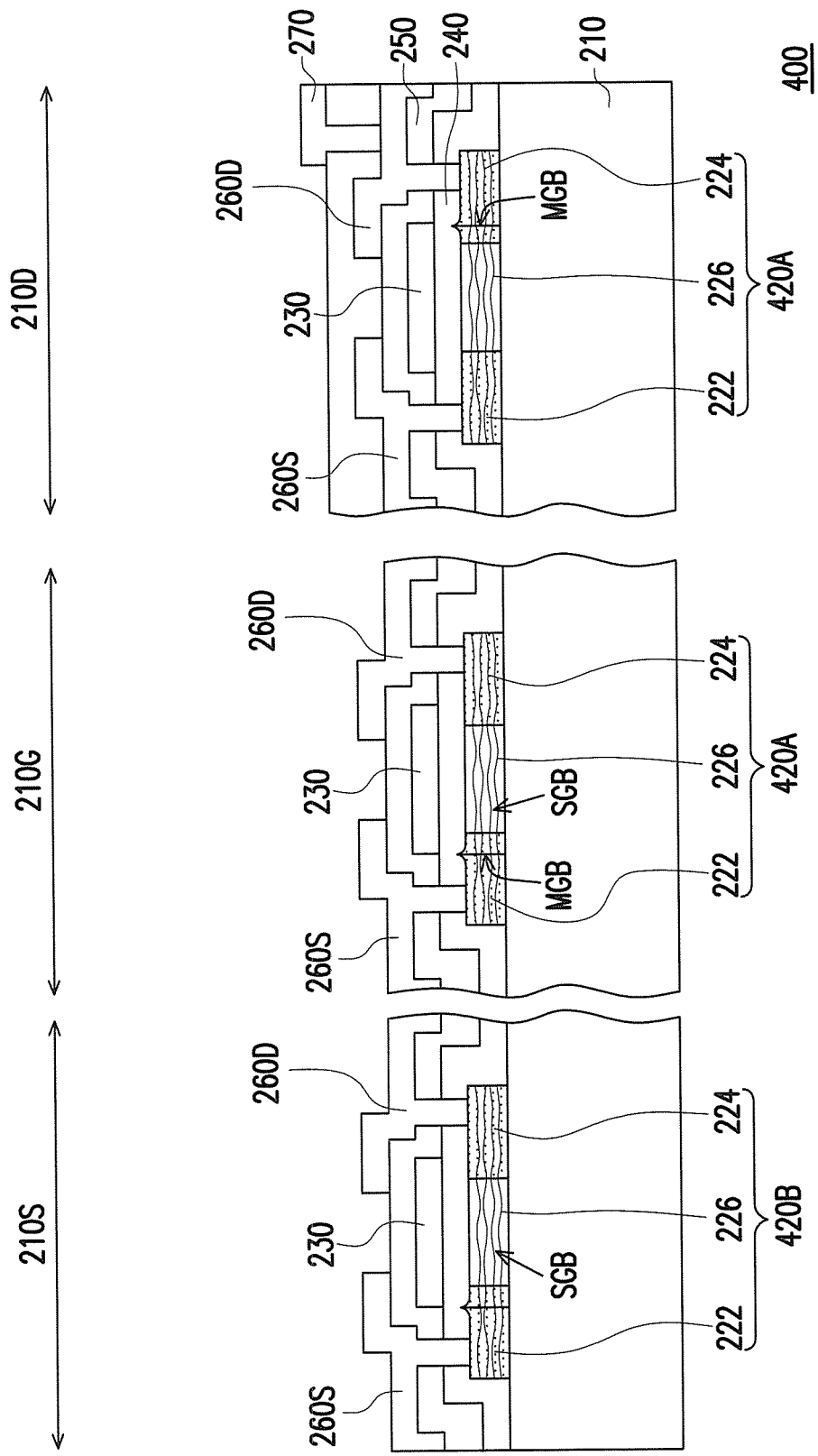
FIG. 6A are schematic cross-sectional views along lines AA, BB and CC of FIG. 1A of a TFT array substrate according to the third embodiment of the present invention.

FIG. 6A are schematic cross-sectional views along lines AA, BB and CC of FIG. 1A of a TFT array substrate according to the third embodiment of the present invention. Referring to FIG. 6A, in order to illustrate simply, similar components mentioned above are not repeatedly illustrated. Compared to the second embodiment, main grain boundaries MGB of second poly-silicon islands 420B of a TFT array substrate 400 according to the present embodiment are only disposed within the source regions 222 and/or the drain regions 224 (such as within at least one of the source regions 222 and the drain regions 224). In other words, the channel regions 226 of the second poly-silicon islands 420B do not have any main grain boundaries MGB. In addition, according to the present embodiment, grain sizes of the second poly-silicon islands 420B on the TFT array substrate 400 are substantially larger than grain sizes of the first poly-silicon film.

FIG. 6B is a view showing a grain arrangement status of a poly-silicon film of a TFT after the poly-silicon film has crystallized according to the second embodiment of the present invention. Referring to FIG. 6B, the poly-silicon film predetermined to form the second poly-silicon islands 420B in the source driver region 210S has the main grain boundaries MGB and sub grain boundaries SGB, so that after the poly-silicon islands in the region are patterned, referring to FIG. 6A, the manner, in which the main grain boundaries MGB and the sub grain boundaries SGB are disposed only in the source regions 222 and/or the drain regions 224 of the second poly-silicon islands 420B, is formed. The main grain boundaries MGB of the second poly-silicon islands 420B are arranged periodically with the distances S2, wherein the distances S2 between two adjacent main grain boundaries MGB are generally defined as the grain sizes S2 of the second poly-silicon islands 420B. Referring to FIG. 6A, in the display region 210D and the gate driver region 210G, the main grain boundaries MGB of the poly-silicon film predetermined to form the first poly-silicon islands 420A are arranged periodically with the distance S1, wherein S2<S1.

When using the above method of fabricating the poly-silicon layer 492 by using the laser beam L to irradiate the amorphous silicon layer 290, as in FIG. 6B according to the present embodiment, step (A) is performed for n times, and step (B) is performed once subsequently. The procedure of performing step (A) for n times and performing step (B) once subsequently is operated several times to form the poly-silicon layer 492 that has the main grain boundaries MGB which are arranged periodically with the distances S2. On the other hand, in the display region 210D and the gate driver region 210G, in a step of converting the amorphous silicon layer 490 into the poly-silicon layer 292, for example, step (A) is performed repeatedly for m times and step (B) is performed once subsequently, and the procedure of performing step (A) for m times and performing step (B) once subsequently is operated several times to form the poly-silicon layer 492 that has the main grain boundaries MGB which are arranged periodically with the distances S1. In addition, according to the present embodiment, in the above step of crystallizing the poly-silicon layer 492, n<m, so that after the poly-silicon layer is crystallized, the distances S2 between the main grain boundaries of the second poly-silicon islands 420B are less than the distances S1 between the main grain boundaries of the first poly-silicon islands 420A, which is able to represented as S2<S1. Hence, after the poly-silicon layer 492 is patterned, the grain size of the second poly-silicon islands 420B are substantially smaller than the grain sizes of the first poly-silicon film.

Fourth Embodiment

Figure 7A:
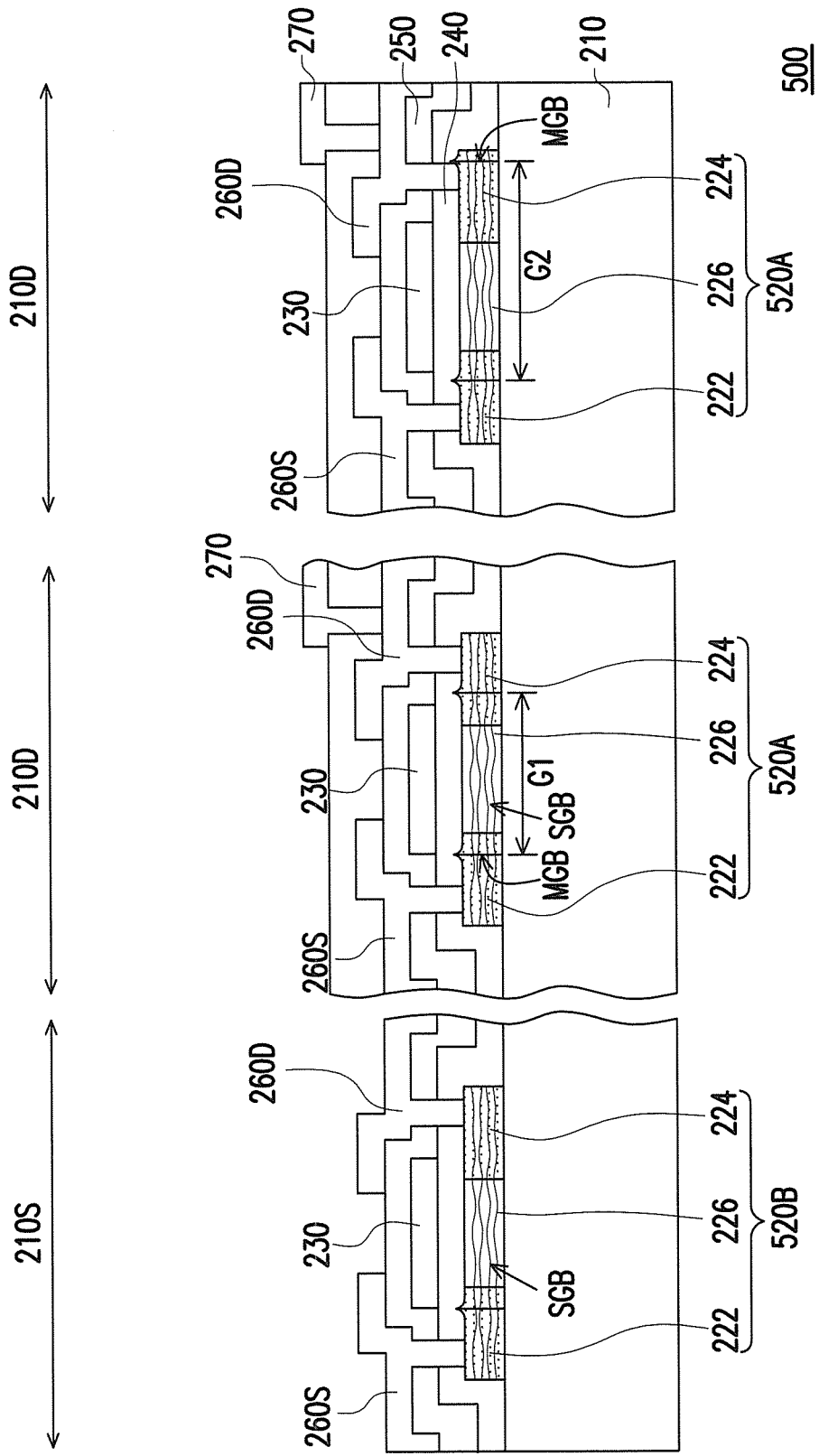
FIG. 7A are schematic cross-sectional views along lines AA, CC and DD of FIG. 1A of a TFT array substrate according to the fourth embodiment of the present invention.

FIG. 7A are schematic cross-sectional views along lines AA, CC and DD of FIG. 1A in a TFT array substrate according to the fourth embodiment of the present invention. Referring to FIG. 7A, in order to illustrate simply, similar components mentioned above are not repeatedly illustrated. Compared with the above embodiments, a second poly-silicon islands 520B of a TFT array substrate 500 according to the present embodiment have only sub grain boundaries SGB, and grain sizes of first poly-silicon islands 520A have various sizes.

Figure 7B:
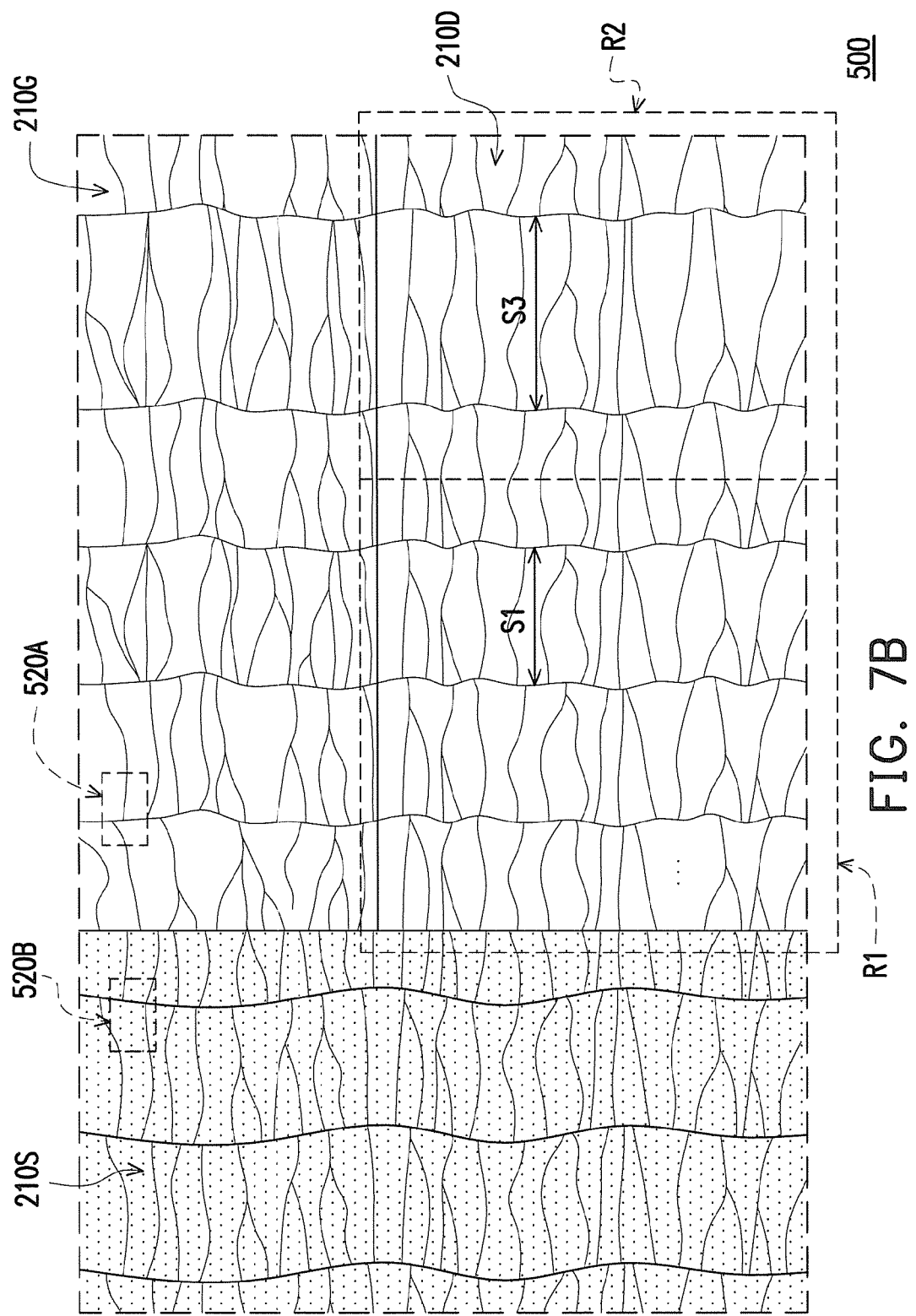
FIG. 7B is a view showing a grain arrangement status of a poly-silicon film of a TFT after the poly-silicon film has crystallized according to the fourth embodiment of the present invention.

FIG. 7B is a view showing a grain arrangement status of a poly-silicon film of a TFT after the poly-silicon film has crystallized according to the fourth embodiment of the present invention. Referring to FIG. 7B, in the source driver region 210S according to the present embodiment, the polysilicon film predetermined to form the second poly-silicon islands 520B has only the sub grain boundaries. Illustrations and methods of fabrication are mentioned previously, so repeated description is omitted. Particularly, referring to all FIGS. 1A, 7A and 7B, the display region 210D and the gate driver region 210G comprise a first region R1 adjacent to the source diver region 210S and a second region R2 far away from the source driver region 210S, wherein the first poly-silicon islands 520A disposed in the first region R1 have first grain sizes G1, while the first poly-silicon islands 520A disposed in the second region R2 have second grain sizes G2, and the first grain sizes G1 are different from the second grain sizes G2. The layout of the first region R1 and the second region R2 on the TFT array substrate depends on device requirements.

In detail, when using the above method of forming the poly-silicon film by using the laser beam L to irradiate the amorphous silicon layer 290, as in FIG. 7B according to the present embodiment, in a step of converting the amorphous silicon layer in the first region R1 into the poly-silicon layer 592, step (A) is performed for m1 times, and step (B) is performed once subsequently. The procedure of performing step (A) for m1 times and performing step (B) once subsequently is operated several times to form the poly-silicon layer 592 that has the main grain boundaries MGB which are arranged periodically with the distances S1. In addition, in the step of converting the amorphous silicon layer in the second region R2 into the poly-silicon layer 592, for example, step (A) is performed for m2 times, and step (B) is performed once subsequently. The procedure of performing step (A) for m2 times and performing step (B) once subsequently is operated several times to form the poly-silicon layer 592 that has the main grain boundaries MGB which are arranged periodically with distances S3. According to the present embodiment, in the above crystallization step of the poly-silicon layer 592 m1<m2, so that after the poly-silicon layer 592 is crystallized, the distances between the main grain boundaries S1<S3. Hence, after the poly-silicon layer 592 is patterned, the grain sizes G1 of the first poly-silicon islands 520A disposed in the first region R1 are substantially smaller than the grain sizes of the first poly-silicon film disposed in the second region R2.

Of course, in the above step of crystallizing the poly-silicon layer 592, m1 may also be greater than m2, so that the grain sizes of the first poly-silicon islands 520A in the first region R1 are substantially larger than the grain sizes of the first poly-silicon film in the second region R2, according to product requirements. The present invention is not limited to the above embodiments.

In summary, the TFT array substrate and the method of fabricating thereof of the present invention include at least all or a part of the following advantages:

(1) Since the main grain boundaries of the first poly-silicon islands are only disposed within the source regions and/or the drain regions of the TFTs and the channel regions of the TFTs do not have the main grain boundaries, the channel regions have high carrier mobility so that the TFTs on the TFT array substrate have high mobility and high reliability.

(2) Since the method of fabricating the TFT array substrate of the present invention performs steps of different scan pitches according to the deployment designs of the TFTs. Furthermore, the times of irradiation with the laser beam and the moving the substrate are decreased, such that processing efficiency and productivity of the TFT array substrate are effectively enhanced.

(3) In the TFT array substrate of the present invention, the main grain boundaries of the poly-silicon is selectively disposed in particular local regions according to electrical requirements of the TFTs in the region. In other words, the grain sizes of the poly-silicon on the TFT array substrate changes according to operational characteristics in different regions, so that the TFT array substrate of the present invention has both expression of device characteristics and processing efficiency.

Although the present invention has been described with reference to the above embodiments, application of the present invention is not limited to these embodiments. It will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A method of fabricating a thin film transistor array substrate, comprising:
   providing a substrate, the substrate comprising a display region, a gate driver region, and a source driver region;
   forming an amorphous silicon layer on the substrate;
   using a laser beam to irradiate the amorphous silicon layer to form a poly-silicon layer, wherein the poly-silicon layer comprises a plurality of main grain boundaries and a plurality of sub grain boundaries, and grain sizes of the poly-silicon layer disposed in the display region and the gate driver region are different from grain sizes of the poly-silicon layer disposed in the source driver region;
   patterning the poly-silicon layer to form a plurality of poly-silicon islands, wherein the poly-silicon islands disposed in the display region and the gate driver region constitute a plurality of first poly-silicon islands, and the poly-silicon islands disposed in the source driver region constitute a plurality of second poly-silicon islands;
   defining a source region, a drain region, and a channel region disposed between the source region and the drain region in each of the first poly-silicon islands and each of the second poly-silicon islands, wherein the main grain boundary of each of the first poly-silicon islands is only disposed within the source region and/or the drain region of each of the first poly-silicon islands; and
   forming a plurality of gates on the substrate to correspond to the channel regions.

2. The method of fabricating the thin film transistor array substrate of claim 1, wherein a method of defining the source regions, the drain regions and the channel regions comprises performing an ion doping process.

3. The method of fabricating the thin film transistor array substrate of claim 1, wherein in a step of using the laser beam to irradiate the amorphous silicon layer to from the poly-silicon layer, the poly-silicon layer formed in the source driver region only has the sub grain boundaries.

4. The method of fabricating the thin film transistor array substrate of claim 1, wherein grain sizes of each of the second poly-silicon islands are a length along a direction of the channel region.

5. The method of fabricating the thin film transistor array substrate of claim 1, wherein in the step of using the laser beam to irradiate the amorphous silicon layer to form the poly-silicon layer, the main grain boundaries of the poly-silicon layer formed in the source driver region are only disposed within the source regions or the drain regions of the second poly-silicon islands.

6. The method of fabricating the thin film transistor array substrate of claim 5, wherein grain sizes of the second poly-silicon islands are substantially larger than grain sizes of the first poly-silicon islands.

7. The method of fabricating the thin film transistor array substrate of claim 5, wherein grain sizes of the second poly-silicon islands are substantially smaller than gain sizes of the first poly-silicon islands.

8. The method of fabricating the thin film transistor array substrate of claim 1, wherein in the step of using the laser beam to irradiate the amorphous silicon layer to form the poly-silicon layer, the grain sizes of the poly-silicon layer formed in different regions of the display region and the gate driver region comprise a plurality of sizes.

9. The method of fabricating the thin film transistor array substrate of claim 8, wherein the display region and the gate driver region comprise a first region and a second region, and the first poly-silicon islands formed in the first region have first grain sizes, while the first poly-silicon islands formed in the second region have second grain sizes, the first grain sizes being different from the second grain sizes.

10. The method of fabricating the thin film transistor array substrate of claim 1, wherein a method of using the laser beam to irradiate the amorphous silicon layer to form the poly-silicon layer comprises:

providing a laser beam, having a beam region of a width W;

irradiating the amorphous silicon layer with the laser beam to melt a part of the amorphous silicon layer moving the laser beam a distance D1 relative to the amorphous silicon layer, wherein D1<0.5W, and irradiating the amorphous silicon layer with the laser beam; and moving the laser beam a distance D2 relative to the amorphous silicon layer, wherein D2≥0.5W, and irradiating the amorphous silicon layer with the laser beam.

11. The method of fabricating the thin film transistor array substrate of claim 10, wherein the step of moving the laser beam the distance D1 relative to the amorphous silicon layer and using the laser beam to irradiate the amorphous silicon layer is performed for a plurality of times.

12. The method of fabricating the thin film transistor array substrate of claim 1, further comprising forming a plurality of sources and a plurality of drains, wherein each of the sources is electrically connected to each of the source regions of the poly-silicon islands and each of the drains is electrically connected to each of the drain regions of the poly-silicon islands.

13. The method of fabricating the thin film transistor array substrate of claim 12, further comprising forming a dielectric layer to cover the gates and a gate insulating layer disposed between the gates and the poly-silicon islands, the dielectric layer having a plurality of openings, wherein each of the sources is electrically connected to each of the corresponding source regions through the openings respectively and each of the drains is electrically connected to each of the corresponding drain region through the openings respectively.

14. The method of fabricating the thin film transistor array substrate of claim 1, further comprising forming a plurality of pixel electrodes, each of the pixel electrodes being electrically connected to each of the drains.

* * * * *